United States Patent
Numata

(10) Patent No.: US 9,445,019 B2
(45) Date of Patent: Sep. 13, 2016

(54) SOLID-STATE IMAGE SENSOR AND IMAGE PICKUP APPARATUS INCLUDING THE SAME

(71) Applicant: CANON KABUSHIKI KAISHA, Tokyo (JP)

(72) Inventor: Aihiko Numata, Inagi (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 15/016,146

(22) Filed: Feb. 4, 2016

(65) Prior Publication Data

US 2016/0234446 A1 Aug. 11, 2016

(30) Foreign Application Priority Data

Feb. 10, 2015 (JP) ................. 2015-024485

(51) Int. Cl.
| | |
|---|---|
| *H04N 3/14* | (2006.01) |
| *H04N 5/335* | (2011.01) |
| *H04N 5/359* | (2011.01) |
| *H04N 5/355* | (2011.01) |
| *H04N 5/378* | (2011.01) |

(52) U.S. Cl.
CPC ............ *H04N 5/359* (2013.01); *H04N 5/3559* (2013.01); *H04N 5/378* (2013.01)

(58) Field of Classification Search
CPC .... H04N 5/359; H04N 5/3559; H04N 5/378; H04N 5/3696; H04N 5/23212; G02B 7/28; G02B 7/34
USPC ....... 348/294, 298, 300, 302, 308, 312, 335, 348/340, 345, 348, 350, 352
See application file for complete search history.

(56) References Cited

U.S. PATENT DOCUMENTS

| | | | | |
|---|---|---|---|---|
| 8,866,947 B2* | 10/2014 | Lenchenkov | ..... | H01L 27/14603 348/294 |
| 2003/0002836 A1* | 1/2003 | Zhong | ..... | G02B 6/105 385/132 |
| 2011/0032398 A1* | 2/2011 | Lenchenkov | ..... | H01L 27/14621 348/294 |
| 2012/0199893 A1 | 8/2012 | Okabe et al. | | |
| 2013/0088626 A1 | 4/2013 | Shoyama | | |
| 2014/0152878 A1* | 6/2014 | Ozawa | ..... | H01L 27/14621 348/273 |
| 2015/0015752 A1 | 1/2015 | Numata | | |

FOREIGN PATENT DOCUMENTS

| | | |
|---|---|---|
| JP | 2004-120391 A | 4/2004 |
| JP | 2004-363193 A | 12/2004 |

* cited by examiner

*Primary Examiner* — Yogesh Aggarwal
(74) *Attorney, Agent, or Firm* — Canon USA, Inc. I.P. Division

(57) ABSTRACT

A solid-state image sensor includes pixels each including first and second photoelectric conversion portions provided in a substrate, the second photoelectric conversion portion having lower sensitivity than the first photoelectric conversion portion; a barrier region provided between the first and second photoelectric conversion portions; a waveguide provided on a light-entrance side of the substrate and including a core and a cladding; and a protective layer provided between the waveguide and the substrate. Seen in a direction perpendicular to the substrate, a center of an exit face of the core is on a first-photoelectric-conversion-portion side with respect to a center of the barrier region in each pixel in a central part of a pixel area. A standard deviation of a refractive-index distribution of the protective layer in a region directly below the exit face of the core is 0.1 or smaller in an in-plane direction of the substrate.

15 Claims, 19 Drawing Sheets

SOLID-STATE IMAGE SENSOR AND IMAGE PICKUP APPARATUS INCLUDING THE SAME

BACKGROUND OF THE INVENTION

1. Field of the Invention

The present invention relates to solid-state image sensors and particularly to a solid-state image sensor included in an image pickup apparatus such as a digital camera.

2. Description of the Related Art

In recent years, there has been an increasing demand for images taken by apparatuses, such as a digital camera, with wider dynamic ranges. In response to such a demand, a solid-state image sensor is proposed by Japanese Patent Laid-Open No. 2004-363193, in which a plurality of photoelectric conversion portions having different areas are provided in each pixel, so that two kinds of pixel signals, which are a high-sensitivity signal and a low-sensitivity signal, are acquired. With a combination of the two signals, the dynamic range is widened.

There has been another increasing demand for a camera capable of taking a moving image and a still image simultaneously. In general, to acquire a smooth moving image, the moving image may be taken with a period of exposure time that substantially corresponds to the frame rate of the reading by a solid-state image sensor. In contrast, to take a still image, the period of exposure time may be set in accordance with the speed at which the object moves. Hence, to take a still image and a moving image simultaneously, two kinds of pixel signals based on different periods of exposure time need to be acquired.

In Japanese Patent Laid-Open No. 2004-120391, a solid-state image sensor is disclosed that includes a plurality of photoelectric conversion elements (equivalent to the photoelectric conversion portions according to Japanese Patent Laid-Open No. 2004-363193) provided in each pixel and being based on different periods of exposure time so that a moving-image signal and a still-image signal can be acquired simultaneously. Photoelectric conversion elements for a relatively short period of exposure time each have a relatively large area, whereas photoelectric conversion elements for a relatively long period of exposure time each have a relatively small area. Furthermore, the sensitivity of photoelectric conversion elements for a moving image is different from the sensitivity of photoelectric conversion elements for a still image.

Note that "sensitivity of a photoelectric conversion portion" is defined by the ratio of the amount of charge accumulated in the photoelectric conversion portion to the quantity of light that is incident on the pixel per unit time.

In each of the solid-state image sensors disclosed by Japanese Patent Laid-Open No. 2004-363193 and Japanese Patent Laid-Open No. 2004-120391, a desired image is taken with a plurality of photoelectric conversion portions that are provided in each of pixels and having different levels of sensitivity. In each of the devices, light is condensed by a microlens provided on the surface of the pixel, whereby the light is guided to each of the photoelectric conversion portions. Hence, the quantity of light that is incident on each of the photoelectric conversion portions varies with the angle of incidence of the light on the pixel. Therefore, the photoelectric conversion portions each receive only a portion of the light that is emitted from a specific part of the exit pupil of an image pickup lens used. Consequently, a blurred image of an object that is out of focus may be distorted, resulting in a deterioration of image quality.

The present invention is to suppress the deterioration of image quality by reducing the angular dependence of the sensitivity of each of a plurality of photoelectric conversion portions provided in each pixel and having different levels of sensitivity.

SUMMARY OF THE INVENTION

A solid-state image sensor according to a first aspect of the present invention includes pixels provided in a pixel area. The pixels each include a first photoelectric conversion portion and a second photoelectric conversion portion that are provided in a substrate, the second photoelectric conversion portion having lower sensitivity than the first photoelectric conversion portion; a barrier region provided between the first photoelectric conversion portion and the second photoelectric conversion portion; a waveguide provided on a light-entrance side of the substrate and including a core and a cladding; and a protective layer provided between the waveguide and the substrate. When a surface of the substrate is seen in a direction perpendicular to the substrate, a center of an exit face of the core is positioned on a first-photoelectric-conversion-portion side with respect to a center of the barrier region at the surface of the substrate in each of pixels that are provided in a central part of the pixel area. A standard deviation of a distribution of refractive index of the protective layer in a region directly below the exit face of the core is 0.1 or smaller in an in-plane direction of the substrate.

An image pickup apparatus according to a second aspect of the present invention includes the solid-state image sensor according to the first aspect that is provided in a housing.

Further features of the present invention will become apparent from the following description of exemplary embodiments with reference to the attached drawings.

DESCRIPTION OF THE EMBODIMENTS

Figure 1:
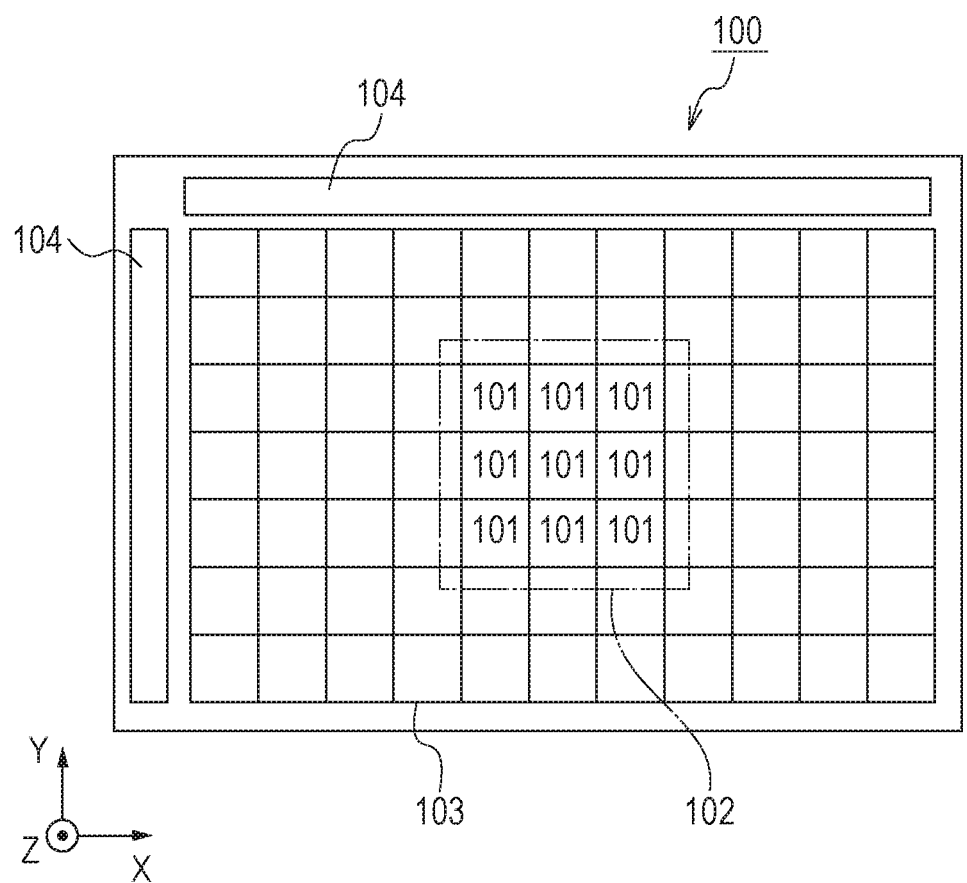
FIG. 1 is a schematic diagram illustrating an exemplary solid-state image sensor according to an embodiment of the present invention.

Embodiments of the solid-state image sensor according to the present invention will now be described with reference to the drawings, wherein like elements or elements having equivalent functions are denoted by like reference numerals, and redundant description thereof is omitted.

FIG. 1 is a schematic diagram illustrating an exemplary solid-state image sensor 100 according to a general embodiment of the present invention. The solid-state image sensor 100 includes a pixel area 103 in which a plurality of pixels are provided, and an area in which peripheral circuits 104 are provided.

Pixels

Pixels 101 refer to pixels provided in a central part 102 of the pixel area 103. Herein, the pixels 101 provided in the central part 102 refer to pixels whose centroids are positioned in the central part 102.

The central part 102 refers to an area within a predetermined distance from the center of the pixel area 103. The predetermined distance is preferably ¼ of the length of the diagonal of the pixel area 103 or shorter, or more preferably ¹⁄₂₀ of the length of the diagonal of the pixel area 103 or shorter.

In the solid-state image sensor 100 illustrated in FIG. 1, the pixels 101 provided in the central part 102 are in a 3-by-3 arrangement, for example. The arrangement of the pixels 101 is not limited to such a pattern. At least one pixel 101 only needs to be provided in the central part 102. Moreover, pixels having the same configuration as the pixel 101 may be provided outside the central part 102.

Figure 2A:
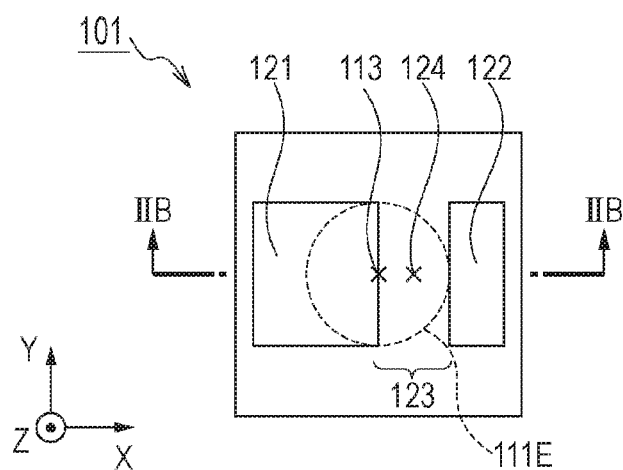
FIGS. 2A to 2C are diagrams illustrating an exemplary configuration of a pixel included in the solid-state image sensor.
Figure 2B:
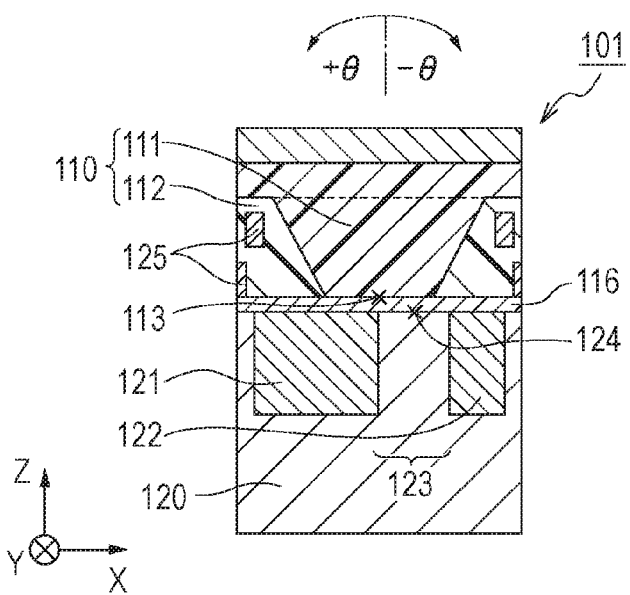
Figure 2C:
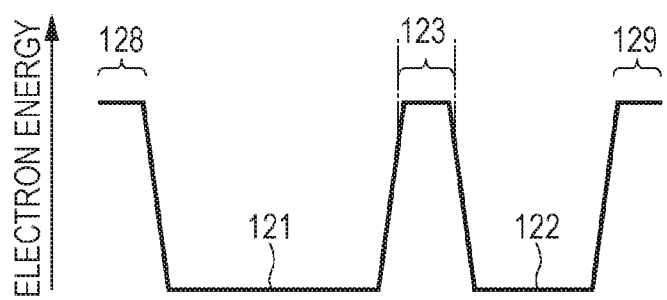

FIGS. 2A to 2C are diagrams illustrating an exemplary configuration of the pixel 101 included in the solid-state image sensor 100. FIG. 2A illustrates a layout of the pixel 101 at a surface of a substrate 120 that is seen in a direction (Z direction) perpendicular to the substrate 120. FIG. 2B is an XZ sectional view of the pixel 101 that is taken along line IIB-IIB illustrated in FIG. 2A.

The pixel 101 includes, in order from a light-entrance side thereof, a waveguide 110 including a core 111 and a cladding 112, a protective layer 116, and the substrate 120. The substrate 120 includes a first photoelectric conversion portion 121, a second photoelectric conversion portion 122, and a barrier region 123 provided between the photoelectric conversion portions 121 and 122.

Photoelectric Conversion Portions and Barrier Region

The photoelectric conversion portions 121 and 122 are formed by producing potential variations in the substrate 120 by ion implantation or the like. The substrate 120 is made of silicon or the like that absorbs light having a wavelength band to be detected. The barrier region 123 has a potential barrier that suppresses the occurrence of charge crosstalk between the first photoelectric conversion portion 121 and the second photoelectric conversion portion 122. As illustrated in FIG. 2C, the barrier region 123 corresponds to a region between the first photoelectric conversion portion 121 and the second photoelectric conversion portion 122 where the potential of the potential barrier is 90% of the highest value or above, inclusive of the highest value.

The size of the potential barrier in the barrier region 123 may be determined with consideration for the permissible amount of charge crosstalk between the first photoelectric conversion portion 121 and the second photoelectric conversion portion 122. To acquire pixel signals for the respective photoelectric conversion portions 121 and 122 independently of each other, the potential barrier may be made high so that the amount of charge crosstalk is reduced. More specifically, the potential barrier in the barrier region 123 may have a height greater than or equal to the height of potential barriers (denoted by reference numerals 128 and 129 in FIG. 2C) provided in other regions excluding the barrier region 123 and surrounding the first photoelectric conversion portion 121 and the second photoelectric conversion portion 122. In such a configuration, the crosstalk between the first photoelectric conversion portion 121 and the second photoelectric conversion portion 122 can be reduced to approximately the same level as the crosstalk between pixels. However, if the permissible amount of charge crosstalk is large, the potential barrier in the barrier region 123 may be lower than the potential barriers provided in the other regions excluding the barrier region 123 and surrounding the first photoelectric conversion portion 121 and the second photoelectric conversion portion 122.

To produce potential variations in the pixel 101 as illustrated in FIG. 2C, a potential barrier may be formed by implanting ions into a region corresponding to the barrier region 123, not in regions corresponding to the first photoelectric conversion portion 121 and the second photoelectric conversion portion 122. Alternatively, ions may be implanted into both the photoelectric conversion portions 121 and 122 and the barrier region 123. In that case, ions implanted into the regions corresponding to the photoelectric conversion portions 121 and 122 and ions implanted into the barrier region 123 may have opposite conductivity characteristics.

The first photoelectric conversion portion 121 and the second photoelectric conversion portion 122 do not necessarily need to be arranged side by side in the X direction as illustrated in FIGS. 2A and 2B and may be arranged side by side in a direction that is at an angle larger than 0° with respect to the X axis. Moreover, the shape of the opening in the surface of the substrate 120 at each of the first photoelectric conversion portion 121 and the second photoelectric conversion portion 122 is not limited to a rectangle as illustrated in FIG. 2A and may be a circle, an ellipse, a polygon, or the like. The corners of the polygon may each be rounded in a manufacturing process.

Protective Layer

The protective layer 116 is provided for reducing the damage to the photoelectric conversion portions 121 and 122 during a manufacturing process and for preventing impurities from entering the photoelectric conversion portions 121 and 122 from other members such as wiring lines 125. In addition, the protective layer 116 may have another function such as an anti-reflection function of suppressing the reflection of light that is incident on the photoelectric conversion portions 121 and 122 from the core 111. Moreover, the protective layer 116 may include a plurality of layers that are stacked in the direction perpendicular to the surface of the substrate 120.

Waveguide

The waveguide 110 is formed of different materials that are combined such that the core 111 has a higher refractive index than the cladding 112. The materials for the core 111 and the cladding 112 can be selected from inorganic materials such as silicon oxide, silicon nitride, silicon oxynitride, silicon carbide, and borophosphosilicate glass (BPSG), and organic materials such as polymer and resin.

A broken line 111E illustrated in FIG. 2A defines an end facet of the core 111 that is on the side of the substrate 120, i.e., an exit face. In FIG. 2A, the waveguide 110 is provided such that a center 113 of the exit face 111E of the core 111 is positioned on the first-photoelectric-conversion-portion side (−X side) with respect to a center 124 of the barrier region 123. Herein, the center 124 of the barrier region 123 at the surface of the substrate 120 refers to the centroid of a plan-view shape, seen in the Z direction, of the barrier region 123 at the surface of the substrate 120. Likewise, the center 113 of the exit face 111E of the core 111 refers to the centroid of the plan-view shape, seen in the Z direction, of the exit face 111E of the core 111. Hereinafter, for simplicity, the amount of shift of the center 113 of the exit face 111E of the core 111 in the −X direction with respect to the center 124 of the barrier region 123 at the surface of the substrate 120 is occasionally referred to as the amount of shift of the waveguide 110.

Light that is propagated in the waveguide 110 concentrates on the core 111. Therefore, the quantity of light that is incident on the first photoelectric conversion portion 121 provided relatively near the center 113 of the exit face 111E of the core 111 is larger than the quantity of light that is incident on the second photoelectric conversion portion 122 provided relatively far from the center 113 of the exit face 111E of the core 111. That is, shifting the center 113 of the exit face 111E of the core 111 toward the first-photoelectric-conversion-portion side with respect to the center 124 of the barrier region 123 at the surface of the substrate 120 makes the sensitivity of the first photoelectric conversion portion 121 higher than the sensitivity of the second photoelectric conversion portion 122.

The cladding 112 is provided with wiring lines 125 that transmit driving signals for setting periods of exposure time of the respective photoelectric conversion portions 121 and 122 and read the signals acquired by the photoelectric conversion portions 121 and 122. The driving signals that are transmitted from the peripheral circuits 104 to the pixel 101 through the wiring lines 125 activate the first photoelectric conversion portion 121 and the second photoelectric conversion portion 122 on the basis of respective desired periods of exposure time.

SUMMARY

To summarize, in the pixel 101 included in the solid-state image sensor 100 according to the general embodiment of the present invention, light that is incident on the pixel 101 is guided to each of the photoelectric conversion portions 121 and 122 by the waveguide 110 provided in such a manner as to be shifted with respect to the center 124 of the barrier region 123 at the surface of the substrate 120. Employing such a configuration makes the angular dependence of the sensitivity of each of a plurality of photoelectric conversion portions 121 and 122, which have different levels of sensitivity, lower than that observed in the related-art solid-state image sensor in which light that is incident on the pixel is guided to each of the photoelectric conversion portions by using a microlens. Comparison with the case of the related-art solid-state image sensor will be given below.

Angular Dependence of Related-Art Solid-State Image Sensor

Figure 17A:
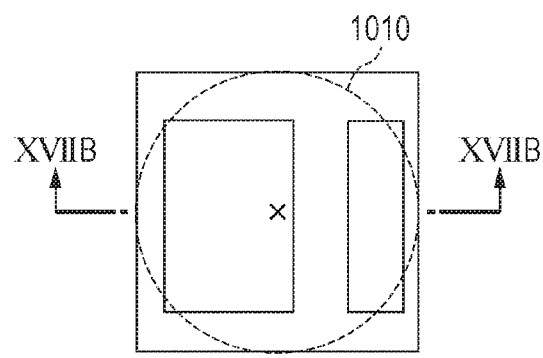
FIG. 17A is a plan view of a pixel included in a related-art solid-state image sensor that is seen from a light-entrance side.
Figure 17B:
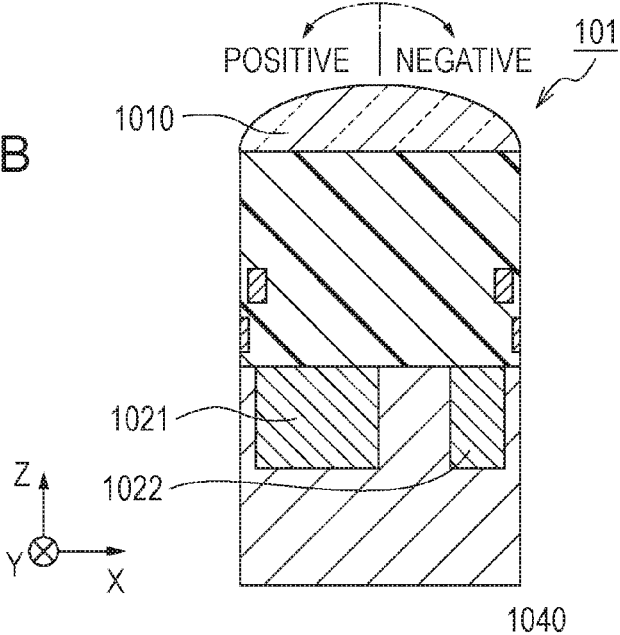
FIG. 17B is a diagram illustrating a sectional configuration of the pixel that is taken along line XVIIB-XVIIB illustrated in FIG. 17A.

FIG. 17A is a diagram illustrating a layout of a pixel 1001 included in the related-art solid-state image sensor, taken for comparison, at a surface (XY plane) of a substrate that is seen from a light-entrance side (seen in a direction perpendicular to the substrate). FIG. 17B is a diagram illustrating a configuration of section (XZ-plane) of the pixel 1001 that is taken along line XVIIB-XVIIB illustrated in FIG. 17A. The pixel 1001 illustrated in FIG. 17B includes no waveguide including a core and a cladding. The pixel 1001 is different from the pixel 101 of the solid-state image sensor 100 according to the general embodiment of the present invention illustrated in FIGS. 2A to 2C in that light that is incident on the pixel 1001 is guided to each of first and second photoelectric conversion portions 1021 and 1022 by a microlens 1010.

Figure 18A:
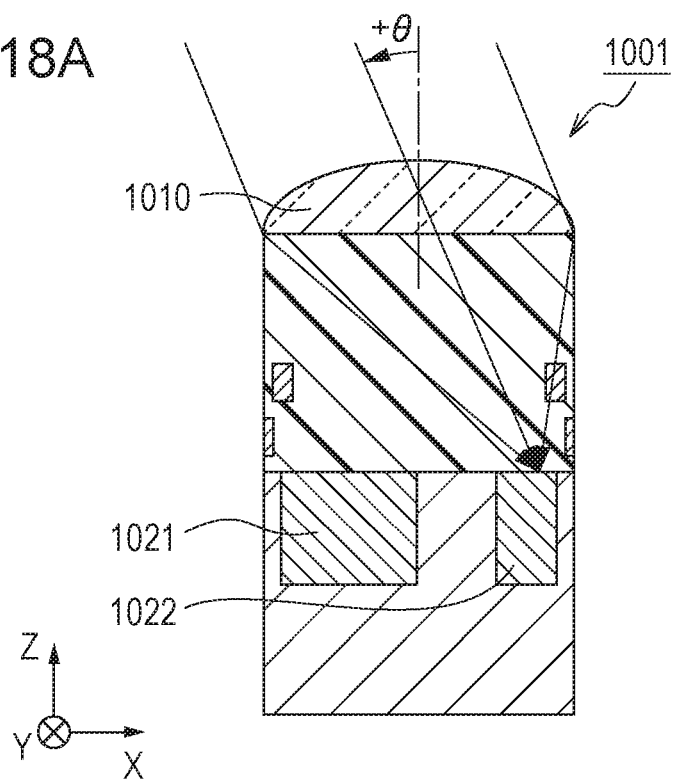
FIG. 18A is a diagram illustrating how a ray of light that is incident on the related-art pixel at an incident angle +θ is propagated.
Figure 18B:
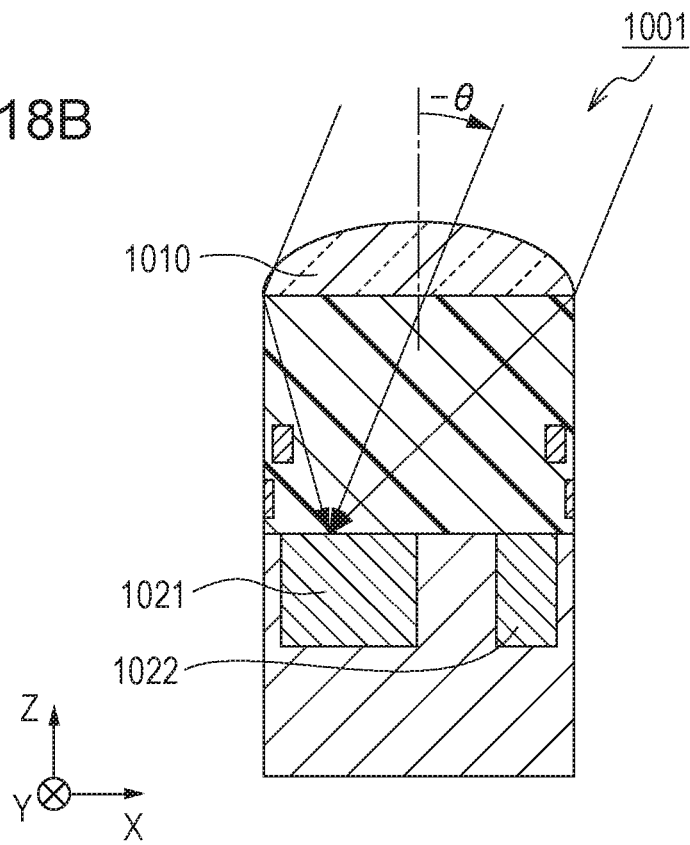
FIG. 18B is a diagram illustrating how a ray of light that is incident on the related-art pixel at an incident angle −θ is propagated.

FIGS. 18A and 18B illustrate how a ray of light that is incident on the pixel 1001 of the related-art solid-state image sensor is propagated. FIG. 18A illustrates how a ray of light traveling in the −Z direction and toward the +X side (at an incident angle +θ) is propagated. FIG. 18B illustrates how a ray of light traveling in the −Z direction and toward the −X side (at an incident angle −θ) is propagated. As illustrated in FIGS. 18A and 18B, in accordance with the focusing characteristic of the microlens 1010, the ray of light traveling in the −Z direction and toward the +X side is selectively guided to the second photoelectric conversion portion 1022, whereas the ray of light traveling in the −Z direction and toward the −X side is selectively guided to the first photoelectric conversion portion 1021. Consequently, the second photoelectric conversion portion 1022 is more sensitive to the ray of light traveling in the −Z direction and toward the +X side, whereas the first photoelectric conversion portion 1021 is more sensitive to the ray of light traveling in the −Z direction and toward the −X side. That is, the sensitivity of the photoelectric conversion portions 1021 and 1022 depends on the angle.

Figure 17C:
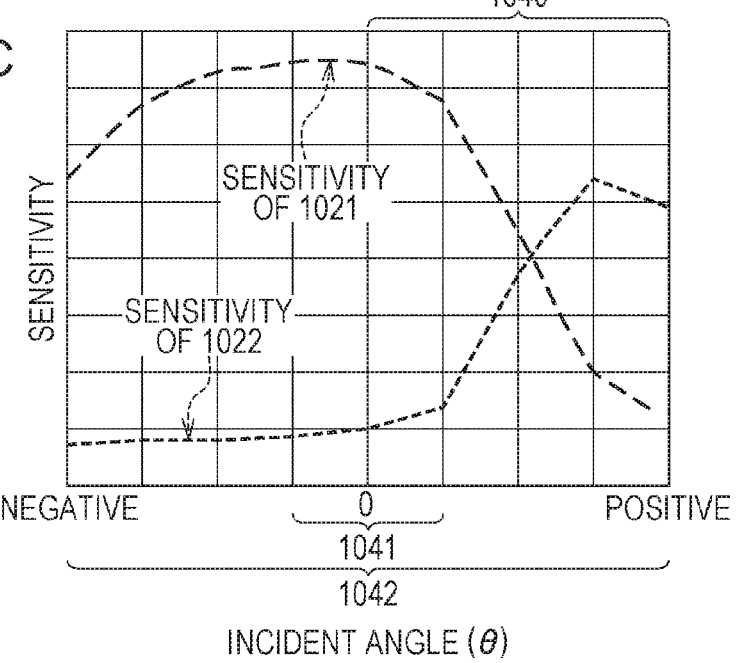
FIG. 17C is an exemplary graph illustrating the dependence, upon the incident angle, of the sensitivity of each of the first and second photoelectric conversion portions included in a pixel according to the related art.

FIG. 17C is an exemplary graph illustrating the dependence, on the incident angle, of the sensitivity of each of the photoelectric conversion portions 1021 and 1022 included in the pixel 1001 provided with the microlens 1010. The horizontal axis represents the incident angle θ of a ray of light that is incident on the pixel 1001. A case of θ=0° means that a ray of light parallel to the optical axis of the microlens 1010 is incident on the pixel 1001.

As can be seen from FIG. 17C, the angular dependence of the sensitivity is particularly high in an angle range 1040 for both the first photoelectric conversion portion 1021 and the second photoelectric conversion portion 1022. If the angular dependence of the sensitivity of the photoelectric conversion portion is high, the photoelectric conversion portion receives only a ray of light emitted from a specific part of the exit pupil of the image pickup lens used. Consequently, a blurred image of an object that is out of focus may be distorted, resulting in a deterioration of image quality.

Position of Waveguide and Angular Dependence

Now, a case where the microlens as the cause for the angular dependence of the pixel is omitted will be discussed. The microlens provided on the light-emission side of the pixel condenses light incident on the pixel from the outside and guides the light to the first photoelectric conversion portion and to the second photoelectric conversion portion provided in the pixel. Hence, if the microlens is simply omitted, particularly, a ray of light that is obliquely incident on the pixel travels straightly, without being condensed, and a portion thereof enters an adjacent pixel. Such a situation increases so-called crosstalk between pixels. Consequently, image quality may be deteriorated.

In contrast, the pixel 101 of the solid-state image sensor 100 according to the general embodiment of the present invention includes the waveguide 110 whose center 113 of the exit face 111E of the core 111 is shifted toward the first-photoelectric-conversion-portion side with respect to the center 124 of the barrier region 123 at the surface of the substrate 120, whereby light is guided to the photoelectric conversion portions 121 and 122, instead of condensing the light by using the microlens. The light that enters the waveguide 110 is emitted after being coupled with a plurality of waveguide modes. Therefore, the intensity distribution of the light at the exit face 111E of the waveguide 110 is more even than that of the light condensed by the microlens. Consequently, the angular dependence of the sensitivity of each of the photoelectric conversion portions 121 and 122 is reduced. Furthermore, a ray of light that is obliquely incident on the pixel 101 is efficiently guided to the photoelectric conversion portions 121 and 122 by the waveguide 110. Therefore, the crosstalk between pixels 101 is also reduced.

Figure 3:
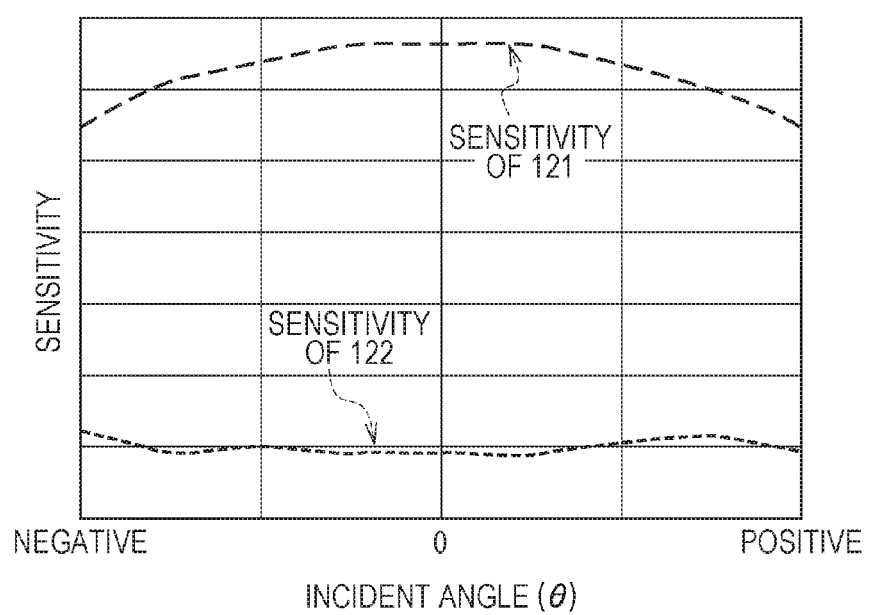
FIG. 3 is a graph illustrating the angular dependence of the sensitivity of each of first and second photoelectric conversion portions.

FIG. 3 is a graph illustrating the angular dependence of the sensitivity of each of the photoelectric conversion portions 121 and 122 included in the pixel 101 illustrated in FIGS. 2A to 2C. The horizontal axis represents the incident angle (θ), in the XZ plane, of a ray of light that is incident on the pixel 101. This applies to all graphs illustrating the angular dependence of the sensitivity of each of the photoelectric conversion portions.

As is obvious from the comparison between FIG. 3 and FIG. 17C, the dependence of the sensitivity of each of the photoelectric conversion portions 121 and 122 upon the incident angle is far lower than that of each of the photoelectric conversion portions 1021 and 1022. The photoelectric conversion portions 121 and 122 each exhibit a substantially uniform sensitivity characteristic, regardless of incident angle. That is, the photoelectric conversion portions 121 and 122 can substantially evenly receive rays of light emitted from all over the exit pupil of the image pickup lens used. Consequently, the distortion of a blurred image of an object that is out of focus is reduced, and image quality is improved.

Amount of Shift of Waveguide from Viewpoint of Sensitivity Ratio

Figure 4A:
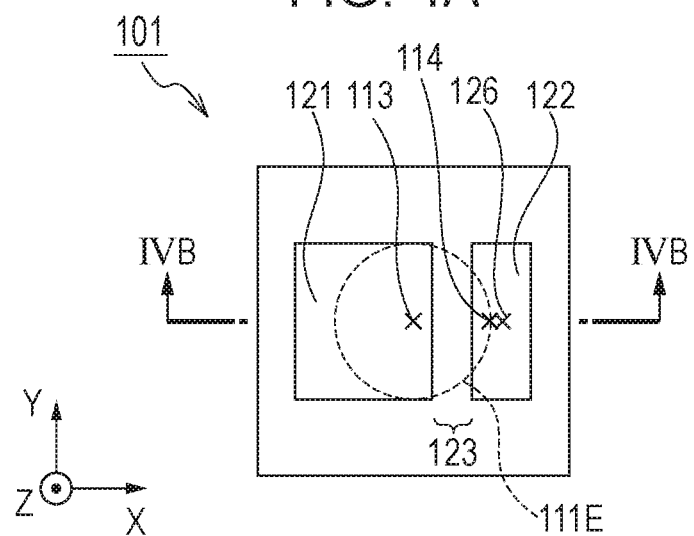
FIG. 4A is an exemplary plan view (XY-plane diagram) of the pixel seen from a light-entrance side.
Figure 4B:
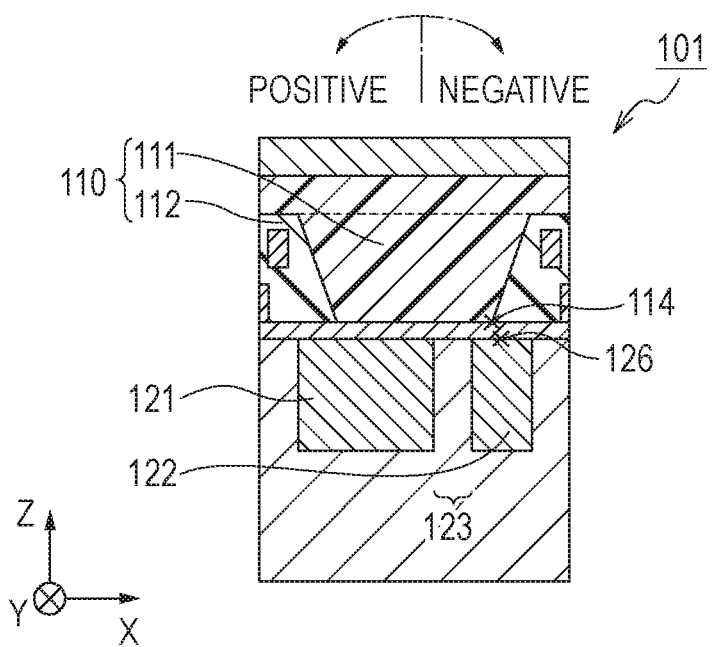
FIG. 4B is an exemplary sectional view of the pixel that is taken along line IVB-IVB illustrated in FIG. 4A.

The amount of shift of the center 113 of the exit face 111E of the core 111 with respect to the center 124 of the barrier region 123 may be changed in accordance with the required sensitivity ratio between the photoelectric conversion portions 121 and 122. To make the sensitivity of the first photoelectric conversion portion 121 satisfactorily higher than the sensitivity of the second photoelectric conversion portion 122, a second-photoelectric-conversion-portion-side end 114 of the exit face 111E of the core 111 may be positioned on the first-photoelectric-conversion-portion side with respect to a center 126 of the second photoelectric conversion portion 122 as illustrated in FIGS. 4A and 4B. FIG. 4A is a plan view (XY-plane diagram) of the pixel 101 seen from the light-entrance side (the pixel 101 seen in the direction perpendicular to the substrate 120). FIG. 4B is a sectional view of the pixel 101 that is taken along line IVB-IVB illustrated in FIG. 4A. The second-photoelectric-conversion-portion-side end 114 of the exit face 111E of the core 111 refers to a point of a plan-view shape, seen in the Z direction, of the exit face 111E of the core 111 that is at the extreme end on the second-photoelectric-conversion-portion side (a point where the X coordinate is largest in FIG. 4A). The center 126 of the second photoelectric conversion portion 122 refers to the centroid of the plan-view shape, seen in the Z direction, of the second photoelectric conversion portion 122 at the surface of the substrate 120.

Figure 5:
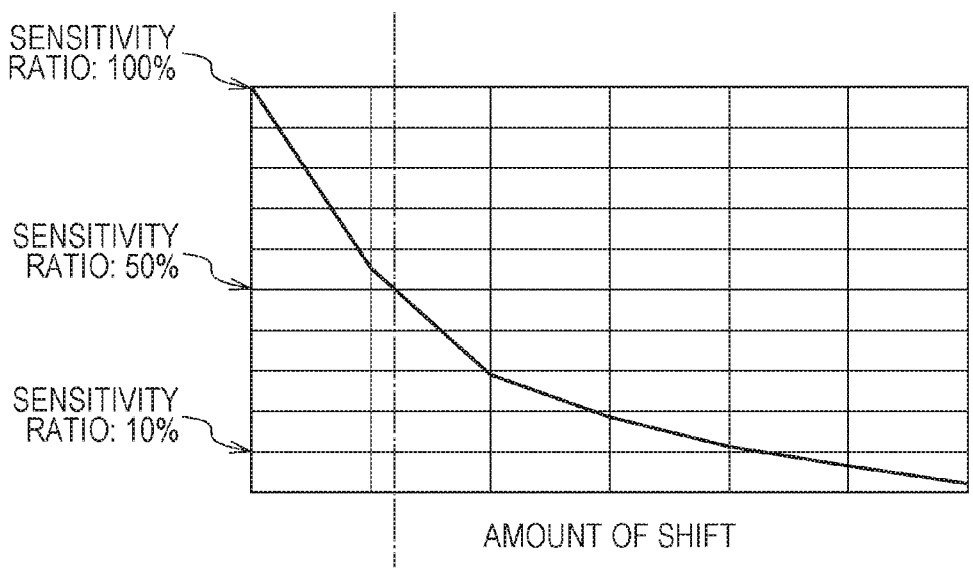
FIG. 5 is a graph illustrating a relationship between the amount of shift of a waveguide and the sensitivity ratio between the photoelectric conversion portions.

FIG. 5 illustrates a relationship between the amount of shift of the waveguide 110 (represented by the horizontal axis of the graph) and the sensitivity ratio=(the sensitivity of the second photoelectric conversion portion 122)/(the sensitivity of the first photoelectric conversion portion 121) (represented by the vertical axis of the graph). The dash-dot line drawn in FIG. 5 represents a case where the second-photoelectric-conversion-portion-side end 114 of the exit face 111E of the core 111 coincides with the center 126 of the second photoelectric conversion portion 122. Accordingly, the zone on the right side with respect to the dash-dot line corresponds to a case where the end 114 is on the −X side (the first-photoelectric-conversion-portion side) with respect to the center 126, which corresponds to the positional relationship illustrated in FIGS. 4A and 4B. The zone on the left side with respect to the dash-dot line corresponds to a case where the end 114 is on the +X side with respect to the center 126. As can be seen from FIG. 5, if the end 114 is on the +X side with respect to the center 126, the sensitivity ratio is higher than 50%, which means there is substantially no difference in sensitivity between the first photoelectric conversion portion 121 and the second photoelectric conversion portion 122. Hence, the second-photoelectric-conversion-portion-side end 114 of the exit face 111E of the core 111 may be positioned on the first-photoelectric-conversion-portion side with respect to the center 126 of the second photoelectric conversion portion 122.

Figure 6A:
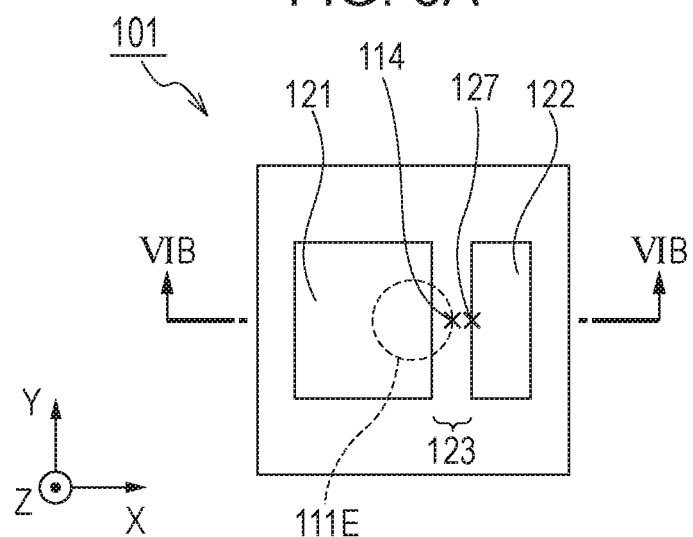
FIG. 6A is an exemplary plan view (XY-plane diagram) of another pixel seen from the light-entrance side.
Figure 6B:
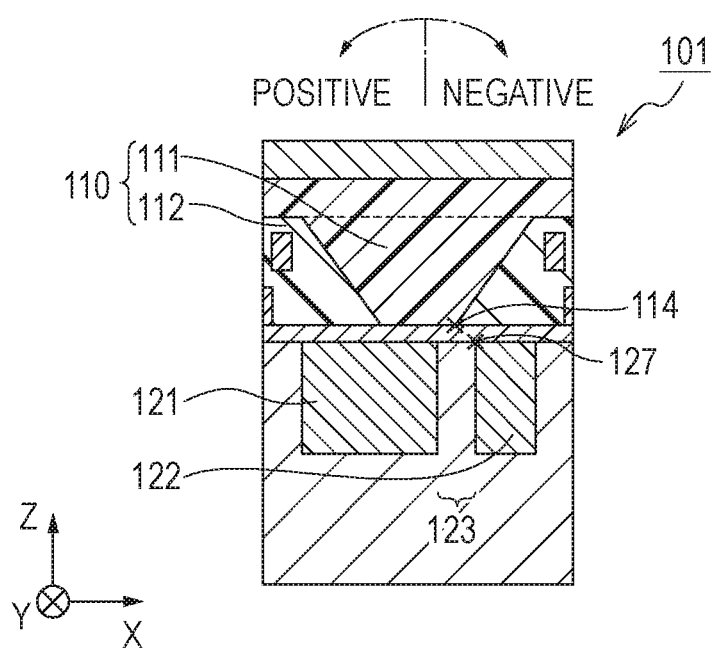
FIG. 6B is an exemplary sectional view of the pixel that is taken along line VIB-VIB illustrated in FIG. 6A.

Amount of Shift of Waveguide from Viewpoint of Angular Dependence of Sensitivity As illustrated in FIGS. 6A and 6B, the second-photoelectric-conversion-portion-side end 114 of the exit face 111E of the core 111 may be positioned on the first-photoelectric-conversion-portion side with respect to a boundary 127 between the barrier region 123 and the second photoelectric conversion portion 122. Such a configuration can further reduce the angular dependence of the sensitivity of each of the first photoelectric conversion portion 121 and the second photoelectric conversion portion 122.

Moreover, the second-photoelectric-conversion-portion-side end 114 of the exit face 111E of the core 111 may be positioned on the second-photoelectric-conversion-portion side (+X side) with respect to a boundary between the barrier region 123 and the first photoelectric conversion portion 121. If the second-photoelectric-conversion-portion-side end 114 of the exit face 111E of the core 111 is positioned on the −X side with respect to the boundary between the barrier region 123 and the first photoelectric conversion portion 121, substantially all rays of light emitted from the waveguide 110 enter the first photoelectric conversion portion 121. Accordingly, the sensitivity of the second photoelectric conversion portion 122 becomes too low. Consequently, the quality of an image acquired by the second photoelectric conversion portion 122 may be deteriorated.

That is, the best position of the second-photoelectric-conversion-portion-side end 114 of the exit face 111E of the core 111 is a position on the second-photoelectric-conversion-portion side with respect to the boundary between the barrier region 123 and the first photoelectric conversion portion 121 and on the first-photoelectric-conversion-portion side with respect to the boundary 127 between the barrier region 123 and the second photoelectric conversion portion 122.

FIG. 6A is a plan view (XY-plane diagram) of the pixel 101 seen from the light-entrance side (the pixel 101 seen in the direction perpendicular to the substrate 120). FIG. 6B is a sectional view of the pixel 101 that is taken along line VIB-VIB illustrated in FIG. 6A. The boundary 127 between the barrier region 123 and the second photoelectric conversion portion 122 refers to a point of a plan-view shape, seen in the Z direction, of the second photoelectric conversion portion 122 that is at the surface of the substrate 120 and at the extreme end on the first-photoelectric-conversion-portion side (a point where the X coordinate is smallest in FIGS. 6A and 6B).

Figure 7A:
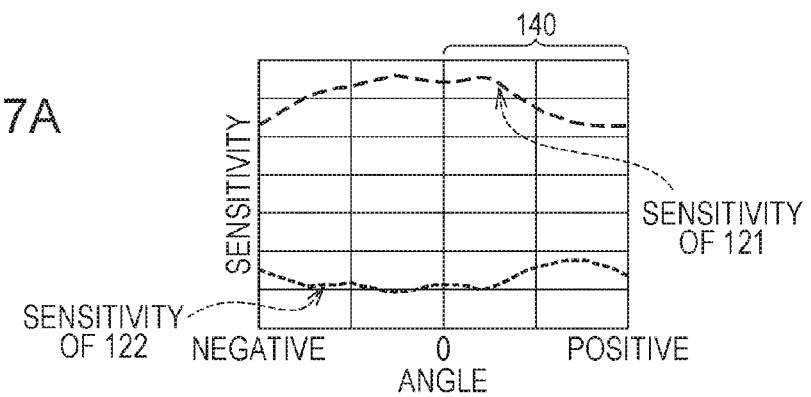
FIGS. 7A to 7D are graphs illustrating the angular dependence of the sensitivity of each of the first and second photoelectric conversion portions with different amounts of shift of the waveguide.
Figure 7B:
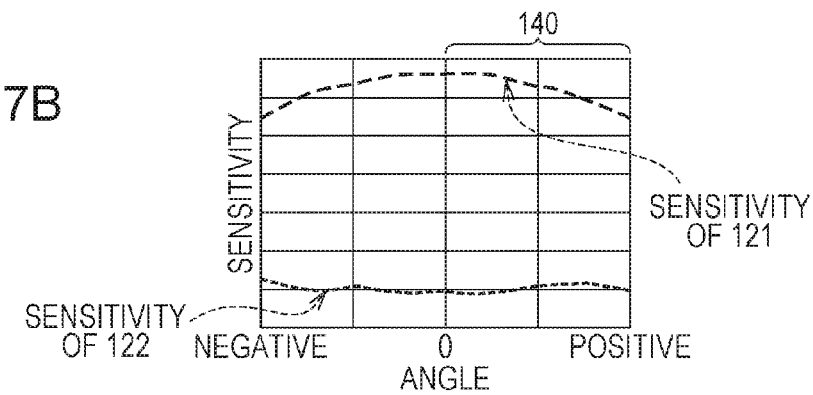
Figure 7C:
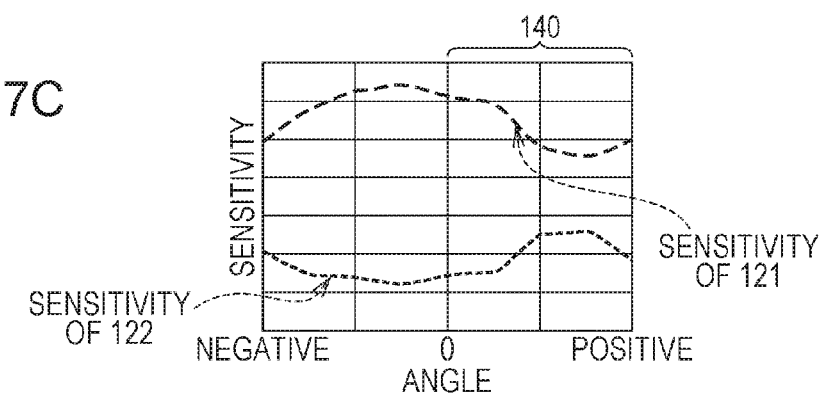
Figure 7D:
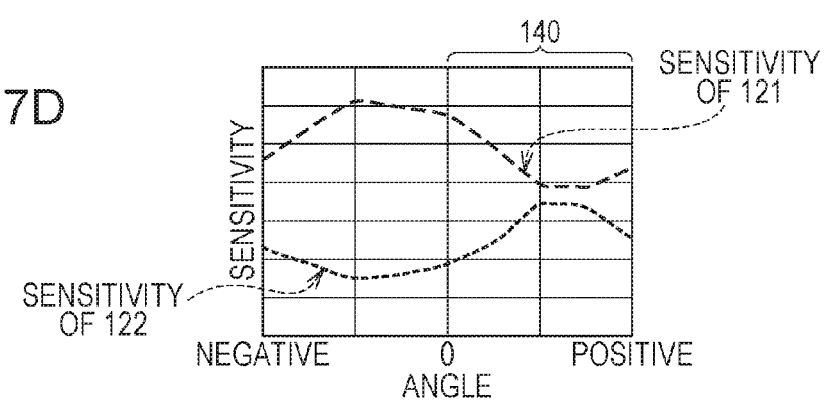

FIGS. 7A to 7D are graphs illustrating the angular dependence of the sensitivity of each of the first photoelectric conversion portion 121 and the second photoelectric conversion portion 122 with different amounts of shift of the waveguide 110. The amount of shift is reduced in order of FIGS. 7A to 7D. FIGS. 7A and 7B each correspond to the arrangement illustrated in FIGS. 6A and 6B, in which the end 114 is positioned on the −X side, i.e., the first-photoelectric-conversion-portion side, with respect to the boundary 127. FIGS. 7C and 7D each correspond to the arrangement illustrated in FIGS. 4A and 4B, in which the end 114 is positioned on the +X side, i.e., the second-photoelectric-conversion-portion side, with respect to the boundary 127.

As can be seen from FIGS. 7A to 7D, the angular dependence of each of the photoelectric conversion portions 121 and 122 is lower in the arrangement corresponding to FIGS. 7A and 7B than in the arrangement corresponding to FIGS. 7C and 7D. That is, if the end 114 is positioned on the first-photoelectric-conversion-portion side (−X side) with respect to the boundary 127 as illustrated in FIGS. 6A and 6B, the angular dependence of the sensitivity of each of the first photoelectric conversion portion 121 and the second photoelectric conversion portion 122 can be reduced further.

The reason for the lower angular dependence of the sensitivity of each of the first photoelectric conversion portion 121 and the second photoelectric conversion portion 122 in the arrangement illustrated in FIGS. 6A and 6B is as follows.

Figure 8A:
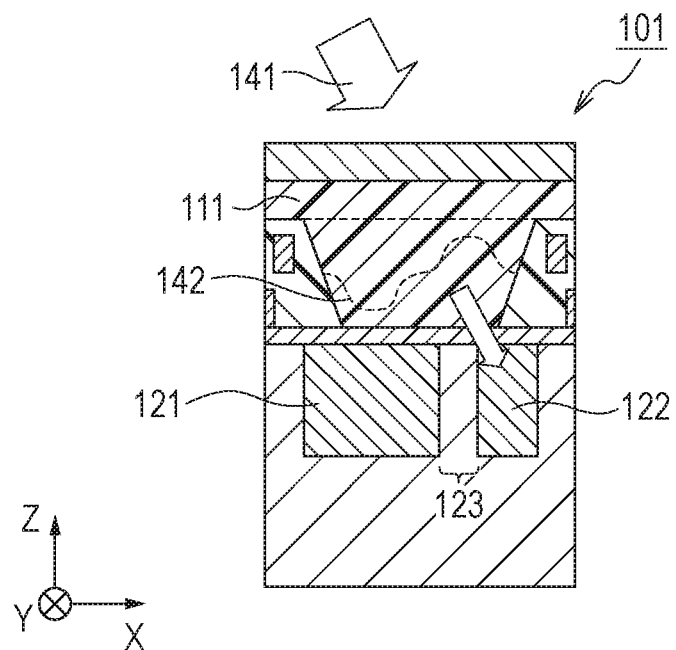
FIG. 8A is a diagram schematically illustrating how a ray of light at an incident angle +θ is propagated in a case where a second-photoelectric-conversion-portion-side end of an exit face of a core is positioned on a second-photoelectricconversion-portion side with respect to a boundary between a barrier region and the second photoelectric conversion portion.

FIG. 8A is a diagram schematically illustrating how a ray of light is propagated in the case where the end 114 is positioned on the second-photoelectric-conversion-portion side (+X side) with respect to the boundary 127. As illustrated in FIG. 8A, a ray 141 traveling in the −Z direction and toward the +X side within an angle range 140, that is, being incident on the pixel 101 at an angle +θ, is selectively coupled with a plurality of specific waveguide modes 142 and exits from the waveguide 110 into the second photoelectric conversion portion 122. The ray having entered the second photoelectric conversion portion 122 is converted into electrons. Most of the electrons are accumulated in the second photoelectric conversion portion 122 with the effect of a strong drift field of the second photoelectric conversion portion 122. Therefore, the sensitivity of the second photoelectric conversion portion 122 with respect to the ray 141 that is incident on the pixel 101 at a specific angle (within the angle range 140 in FIGS. 7A to 7D) is increased, resulting in angular dependence.

Figure 8B:
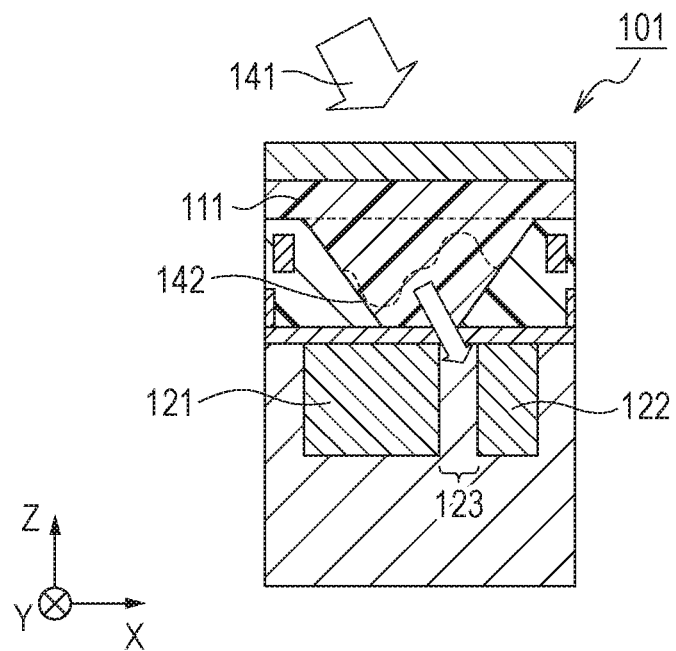
FIG. 8B is a diagram schematically illustrating how the ray of light at the incident angle +θ is propagated in a case where the second-photoelectric-conversion-portion-side end of the exit face of the core is positioned on a first-photoelectric-conversion-portion side with respect to the boundary between the barrier region and the second photoelectric conversion portion.

FIG. 8B illustrates how the ray 141 that is incident on the pixel 101 at an angle +θ is propagated in the case where the end 114 is positioned on the first-photoelectric-conversion-portion side (−X side) with respect to the boundary 127. In this case, as in the case illustrated in FIG. 8A, the ray 141 incident on the pixel 101 at an angle +θ is selectively coupled with the plurality of specific waveguide modes 142, and the ray thus coupled with the waveguide modes 142 exits from the waveguide 110. In this case, however, the ray having exited from the waveguide 110 does not enter the second photoelectric conversion portion 122 but enters the barrier region 123. The ray having entered the barrier region 123 is converted into photoelectrons in the barrier region 123. The photoelectrons are diffused in the substrate 120 and are accumulated in either of the photoelectric conversion portions 121 and 122. Therefore, the angular dependence of the sensitivity of each of the photoelectric conversion portions 121 and 122 is lower than in the case illustrated in FIG. 8A.

That is, the angular dependence of the sensitivity of each of the first photoelectric conversion portion 121 and the second photoelectric conversion portion 122 can further be made lower in the case where the end 114 is positioned on the −X side with respect to the boundary 127 than in the case where the end 114 is positioned on the +X side with respect to the boundary 127.

As can be seen from the comparison between the case illustrated in FIGS. 7C and 7D and the case illustrated in FIG. 17C, even if the end 114 is positioned on the second-photoelectric-conversion-portion side with respect to the boundary 127, the angular dependence of the sensitivity of each of the first photoelectric conversion portion 121 and the second photoelectric conversion portion 122 is lower than that observed in the related-art solid-state image sensor. This is because even the ray that has been coupled with a plurality of specific waveguide modes 142 exhibits a more even distribution of light intensity at the exit face 111E of the waveguide 110 than in the case where light is condensed with a microlens.

Supplementary Explanation

The areas of the first photoelectric conversion portion 121 and the second photoelectric conversion portion 122 may be different as illustrated in FIGS. 2A to 2C or the same. Even if the photoelectric conversion portions 121 and 122 have the same aperture area, the first photoelectric conversion portion 121 and the second photoelectric conversion portion 122 can have different levels of sensitivity, as long as the center 113 of the exit face 111E of the core 111 is shifted with respect to the center 124 of the barrier region 123.

If the first photoelectric conversion portion 121 and the second photoelectric conversion portion 122 are arranged side by side in the XY plane and in a direction that is at an angle β (>0°) with respect to the X axis, the center 113 of the exit face 111E of the core 111 is shifted along the surface of the substrate 120 with respect to the center 124 of the barrier region 123 and in a direction that is at the angle β with respect the X axis.

Protective Layer and Angular Dependence

Now, the thickness of the protective layer 116 will be described.

FIGS. 9A to 9D are graphs illustrating the angular dependence of the sensitivity of each of the first photoelectric conversion portion 121 and the second photoelectric conversion portion 122 with different values of optical distance L between the exit face 111E of the core 111 and the surface of the substrate 120, i.e., with different thicknesses t of the protective layer 116. The optical distance L refers to an actual distance t multiplied by a refractive index n of the protective layer 116, which is expressed as L=n*t. If the protective layer 116 includes a plurality of different layers, the optical distance L is the sum of values each being the actual distance of a corresponding one of the layers that is multiplied by the refractive index of that layer.

The optical distance L increases in order of FIGS. 9A to 9D.

Figure 9A:
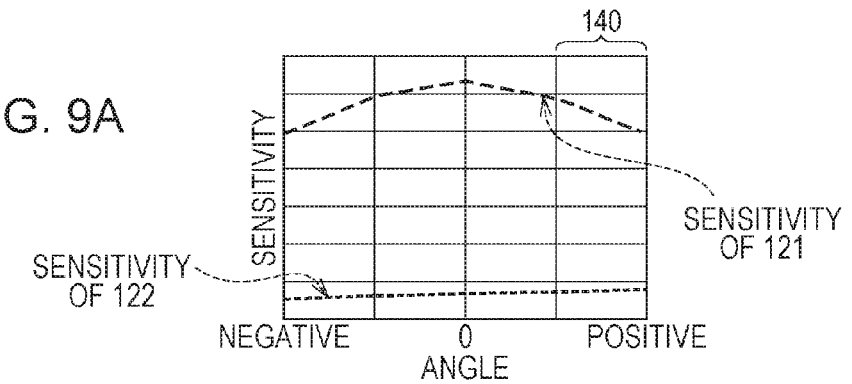
FIGS. 9A to 9D are graphs illustrating the angular dependence of the sensitivity of each of the first and second photoelectric conversion portions with different values of the optical distance between the exit face of the core and the surface of a substrate.
Figure 9B:
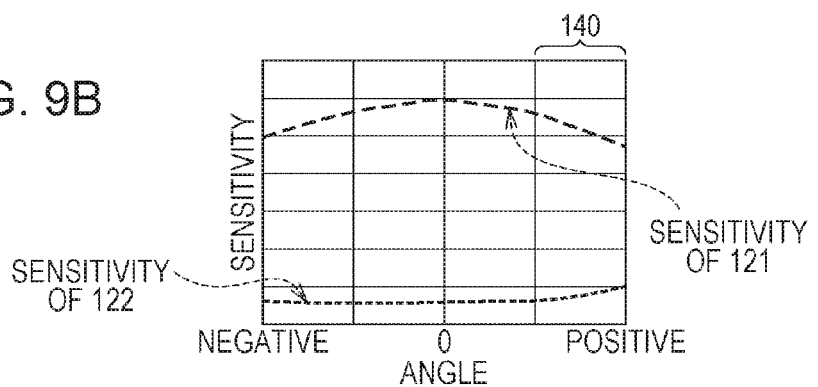
Figure 9C:
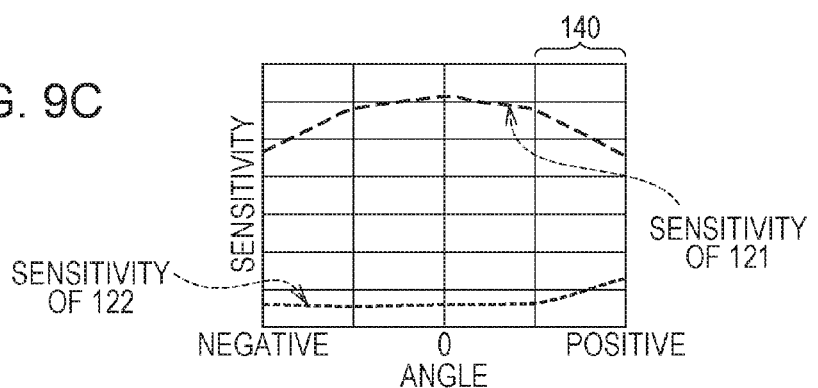
Figure 9D:
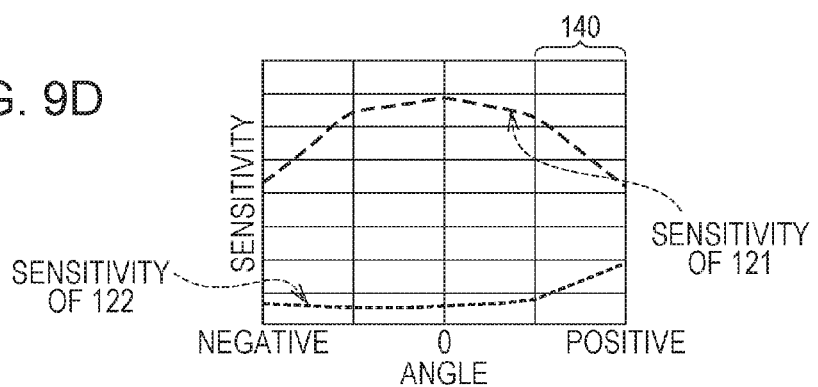

FIGS. 9A and 9B illustrate cases where L/λ is 0.5 and 1.5, respectively. The value L/λ is obtained by dividing the optical distance L by a center wavelength λ of light that is sensible by the first photoelectric conversion portion 121 and the second photoelectric conversion portion 122. FIGS. 9C and 9D illustrate cases where L/λ is 2.6 and 3.8, respectively. As can be seen from FIGS. 9A to 9D, the angular dependence of the sensitivity of each of the first photoelectric conversion portion 121 and the second photoelectric conversion portion 122 is lower in the cases illustrated in FIGS. 9A and 9B than in the cases illustrated in FIGS. 9C and 9D particularly in an angle range 140.

That is, the distance between the exit face 111E of the core 111 and a light-entrance-side surface of the substrate 120 may be short. Specifically, the optical distance L between the exit face 111E of the core 111 and the surface of the substrate 120 may be set to twice the wavelength of light that is sensible by the photoelectric conversion portions 121 and 122 or shorter. Herein, the case where the light is sensible by the photoelectric conversion portions 121 and 122 refers to a case where 5% or more of the light that is incident on the pixel 101 is absorbed by a combination of the photoelectric conversion portions 121 and 122.

The reason for the above is as follows. As described above, a ray that is incident on the pixel 101 at an angle within the angle range 140 is selectively coupled with a plurality of specific waveguide modes 142. Then, the ray exits from the exit face 111E of the core 111 and is coupled with a specific propagation mode in the protective layer 116. Hence, if the distance between the exit face 111E of the core 111 and the surface of the substrate 120 is long, the ray exited from the exit face 111E of the core 111 is propagated within the protective layer 116 before reaching the surface of the substrate 120. A portion of the ray propagated in such a manner enters the second photoelectric conversion portion 122 and is converted into electric charge. Most of such electric charge is accumulated in the second photoelectric conversion portion 122. Therefore, the sensitivity of the second photoelectric conversion portion 122 for the ray that is incident on the pixel 101 at a specific angle is increased, resulting in angular dependence of sensitivity.

Comparing FIGS. 9C and 9D with FIG. 17C, the angular dependence of the sensitivity is lower than that observed in the related-art solid-state image sensor even if the optical distance L between the exit face 111E of the waveguide 110 and the surface of the substrate 120 is longer than twice the wavelength of the light that is sensible by the photoelectric conversion portions 121 and 122. This is because, as described above, the intensity distribution, at the exit face 111E of the waveguide 110, of the light coupled with the plurality of specific waveguide modes 142 is also more even than that of the light condensed by the microlens.

The distribution of refractive index of the protective layer 116 in a region directly below the exit face 111E of the core 111 may be even in the in-plane direction of the substrate 120 (in the XY plane). If the refractive index of the protective layer 116 varies in the in-plane direction, the propagation mode of the ray having exited from the waveguide 110 with a nearly even distribution is changed by the refractive-index variation in the XY direction before the ray reaches the surface of the substrate 120. Consequently, the angular dependence of the sensitivity of each of the first photoelectric conversion portion 121 and the second photoelectric conversion portion 122 is increased. The state where the distribution of refractive index is even refers to a state where the standard deviation of the distribution of refractive index is 0.1 or lower.

The distribution of refractive index of the protective layer 116 is obtained by measuring the refractive index of the protective layer 116 in the region directly below the exit face 111E of the core 111 at five or more points on a line connecting the respective centroids of the first photoelectric conversion portion 121 and the second photoelectric conversion portion 122, including a point on the barrier region 123 and a point on the first photoelectric conversion portion 121. The points of measurement are all at the same distance from the surface of the substrate 120 in the thickness direction. Specifically, if the protective layer 116 includes a plurality of layers, the refractive index is measured within one layer.

The refractive index is measurable with an interferometer, an ellipsometer, or the like. Alternatively, the composition of the material for the protective layer 116 may first be analyzed by Fourier-transform infrared spectroscopy (FTIR), x-ray diffractometry (XRD), mass analysis, or the like, and the result may be converted into refractive index.

Shape and Position of Waveguide

Figure 10A:
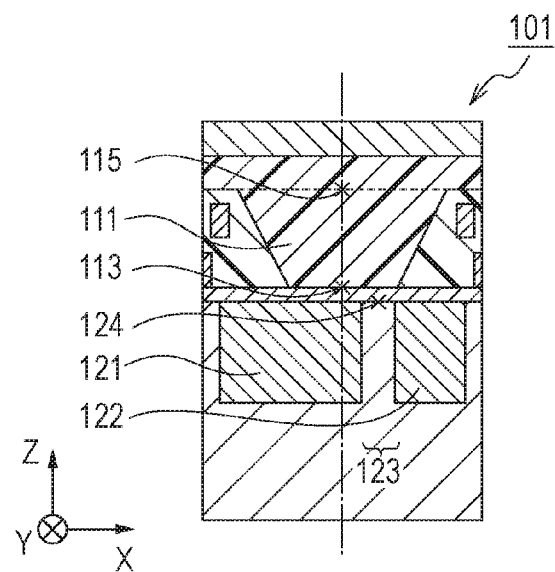
FIG. 10A is a diagram illustrating an exemplary case where, seen in a direction perpendicular to the surface of the substrate, the center of an entrance face of the core coincides with the center of the exit face of the core.
Figure 10B:
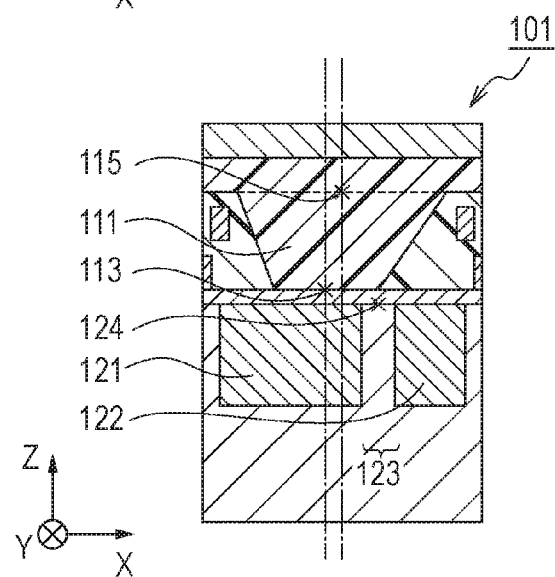
FIG. 10B is a diagram illustrating an exemplary case where the center of the entrance face of the core is shifted toward the second-photoelectric-conversion-portion side with respect to the center of the exit face of the core in an in-plane direction of the substrate.
Figure 10C:
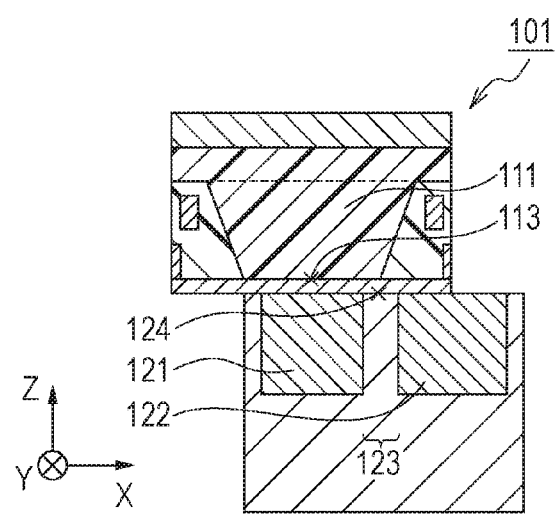
FIG. 10C is a diagram illustrating an exemplary case where a part of the core of the waveguide extends over an adjacent pixel.

The shape of the waveguide 110 according to the general embodiment of the present invention is not limited to the shape illustrated in FIGS. 2A and 2B, as long as the center 113 of the exit face 111E of the core 111 is shifted toward the first-photoelectric-conversion-portion side (−X side) with respect to the center 124 of the barrier region 123 at the surface of the substrate 120. For example, as illustrated in FIG. 10A, seen in the direction (Z direction) perpendicular to the surface of the substrate 120, a center 115 of an entrance face of the core 111 may coincide with the center 113 of the exit face 111E of the core 111. Alternatively, as illustrated in FIG. 10B, the center 115 of the entrance face of the core 111 may be positioned on the second-photoelectric-conversion-portion side (+X direction) with respect to the center 113 of the exit face 111E of the core 111 in the in-plane direction (XY direction) of the substrate 120. Moreover, as illustrated in FIG. 10C, a part of the core 111 of the waveguide 110 may extend over an adjacent pixel 101. Note that, to avoid the occurrence of crosstalk between adjacent pixels 101, a first-photoelectric-conversion-portion-side end of the exit face 111E of the core 111 may be prevented from being positioned over an adjacent pixel 101. The first-photoelectric-conversion-portion-side end of the exit face 111E of the core 111 refers to a point of a plan-view shape, seen in the Z direction, of the exit face 111E of the core 111 that is at the extreme end on the first-photoelectric-conversion-portion side (a point where the X coordinate is smallest in FIGS. 10A to 10C).

Furthermore, "the center 115 of the entrance face of the core 111" refers to the centroid of a plan-view shape, seen in the Z direction, of the entrance face of the core 111, as with "the center 113 of the exit face 111E of the core 111."

The structure illustrated in FIG. 10A can be fabricated relatively easily. In the structure illustrated in FIG. 10B or 10C, it is easier to position the second-photoelectric-conversion-portion-side end 114 of the exit face 111E of the core 111 on the first-photoelectric-conversion-portion side (−X side) with respect to the boundary 127 between the barrier region 123 and the second photoelectric conversion portion 122. The waveguide 110 illustrated in FIG. 10B can be formed by performing etching after providing sacrificial layers having different thicknesses or by performing multistage etching while providing openings of different sizes.

The plan-view shape of the core 111 is not limited to the circular shape as illustrated in FIG. 2A and may be an elliptical or polygonal shape. The corners of the polygonal shape may be rounded in a manufacturing process.

Microlens

A microlens may be provided on the light-entrance side with respect to the waveguide 110. If a microlens is provided, light that is incident on the pixel 101 can be efficiently guided to the waveguide 110. Note that, if a microlens is provided, the angular dependence of the sensitivity of a region between the photoelectric conversion portions 121 and 122 is increased. Therefore, from the viewpoint of reducing the angular dependence, the microlens is not necessary. However, even if a microlens is provided, the angular dependence of each of the photoelectric conversion portions 121 and 122 is lower than that observed in the related-art solid-state image sensor, because of the following reason.

If no waveguide is provided between the microlens and the photoelectric conversion portions as in the related-art solid-state image sensor, the focusing effect of the microlens directly affects the angular dependence of the sensitivity of the photoelectric conversion portions. In contrast, if a waveguide is provided between the microlens and the photoelectric conversion portions, light transmitted through the microlens is incident on the entrance face of the waveguide. The light thus incident on the entrance face of the waveguide is propagated in the waveguide while being coupled with a plurality of waveguide modes, and is emitted toward the photoelectric conversion portions. Therefore, the distribution of light intensity is more even at the exit face of the waveguide than at the entrance face of the waveguide. That is, the distribution of light intensity can be made more even than in the case of the related-art solid-state image sensor in which light that is incident on the pixel is condensed on the photoelectric conversion portions while being transmitted only through the microlens. Hence, according to the general embodiment of the present invention, even if a microlens is provided on the light-entrance side with respect to the waveguide 110, the angular dependence of the photoelectric conversion portions 121 and 122 can be made lower than that observed in the related-art solid-state image sensor.

Figure 11A:
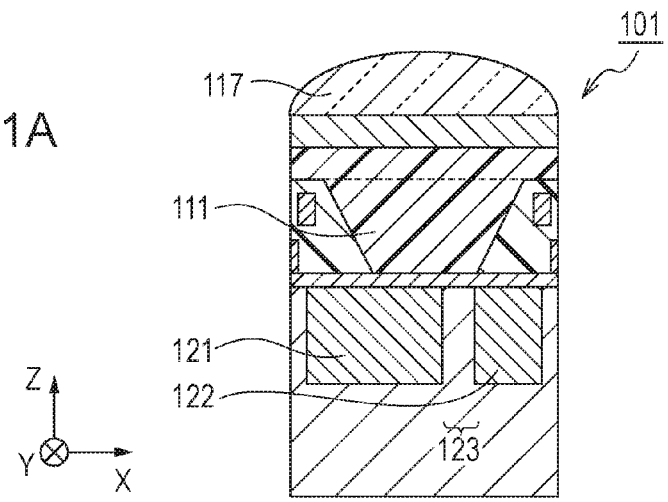
FIG. 11A is a diagram illustrating an exemplary case where a microlens is provided at the extreme end on the light-entrance side of the pixel.
Figure 11B:
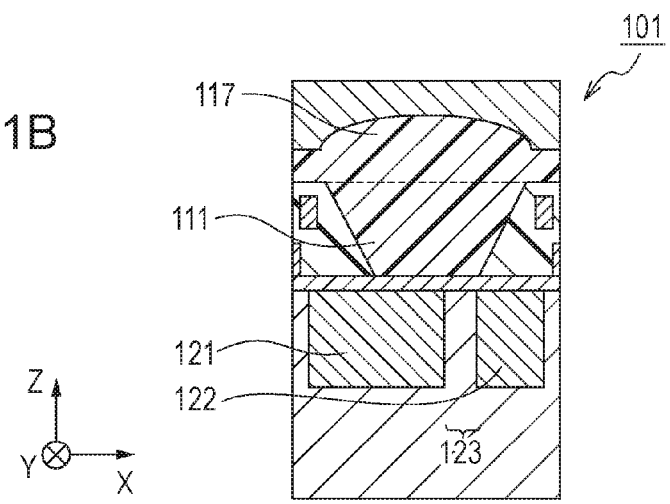
FIG. 11B is a diagram illustrating an exemplary case where a microlens is provided between the waveguide and the uppermost surface of the pixel.
Figure 11C:
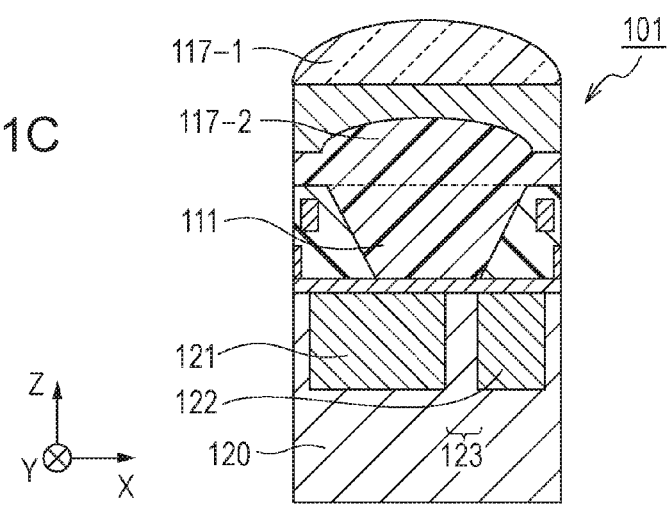
FIG. 11C is a diagram illustrating an exemplary case where microlenses are provided at the extreme end on the light-entrance side of the pixel and between the waveguide and the uppermost surface of the pixel, respectively.

FIG. 11A illustrates an exemplary case where a microlens 117 is provided on the uppermost surface of the pixel 101. FIG. 11B illustrates an exemplary case where a microlens 117 is provided between the waveguide 110 and the uppermost surface of the pixel 101. In this case, the microlens 117 is made of the same material as the core 111. FIG. 11C illustrates an exemplary case where microlenses 117-1 and 117-2 are provided on the uppermost surface of the pixel 101 and between the waveguide 110 and the uppermost surface of the pixel 101, respectively. The microlenses 117 may each be made of an inorganic material such as silicon oxide, silicon nitride, silicon oxynitride, silicon carbide, or BPSG, or an organic material such as polymer or resin.

Microlens Having Different Levels of Refractive Power in Different Directions

Figure 12A:
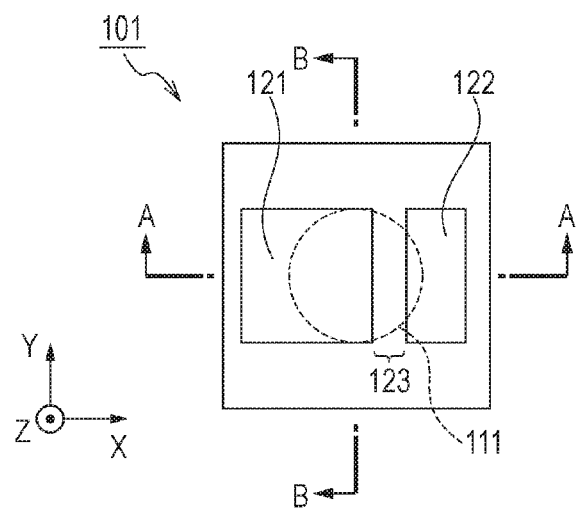
FIGS. 12A to 12D are diagrams illustrating microlenses of different shapes that are applicable to the present invention.
Figure 12B:
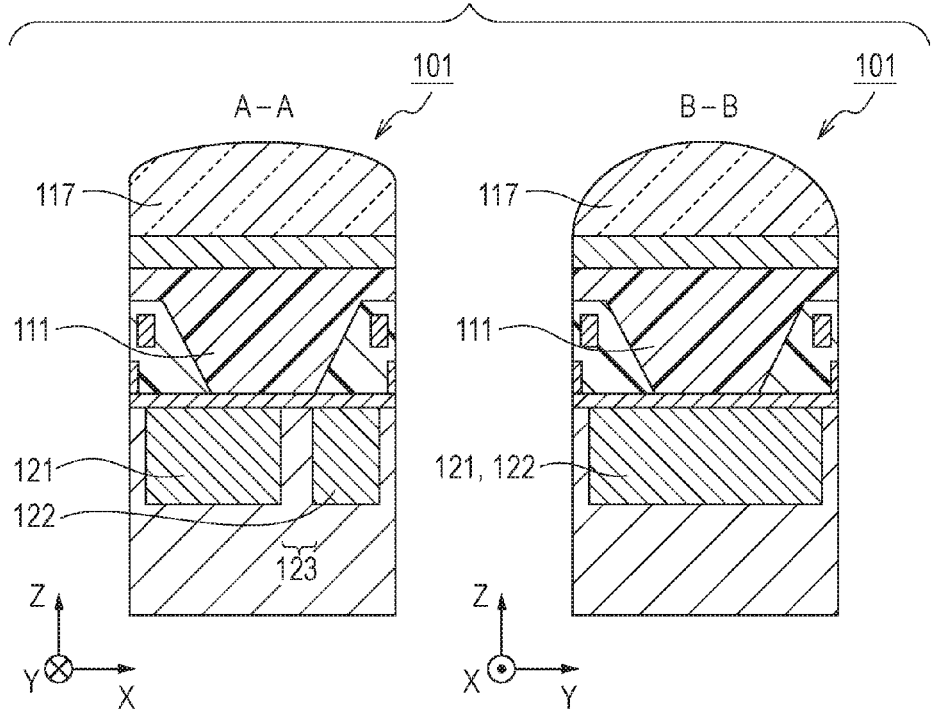
Figure 12C:
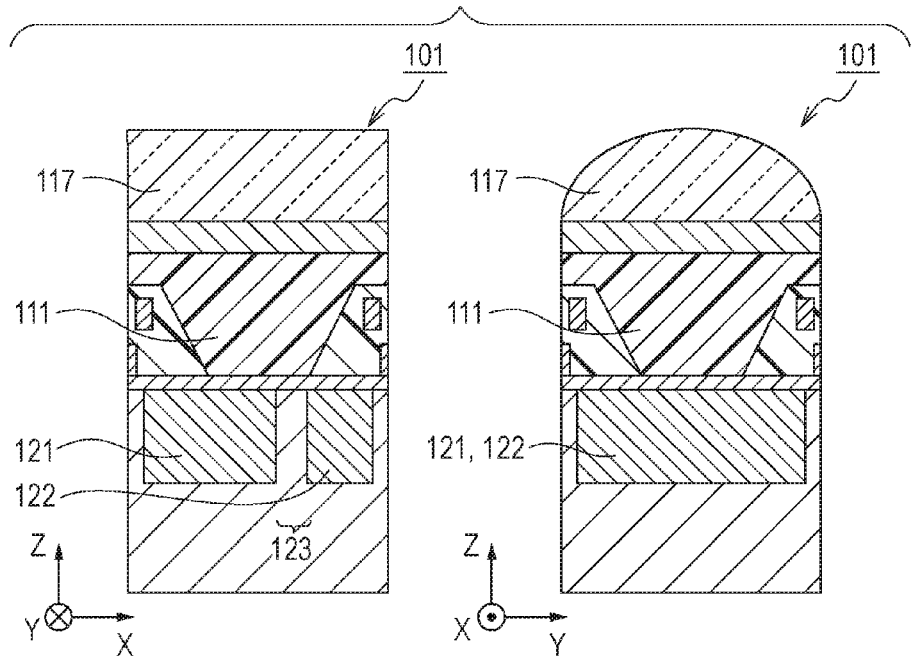
Figure 12D:
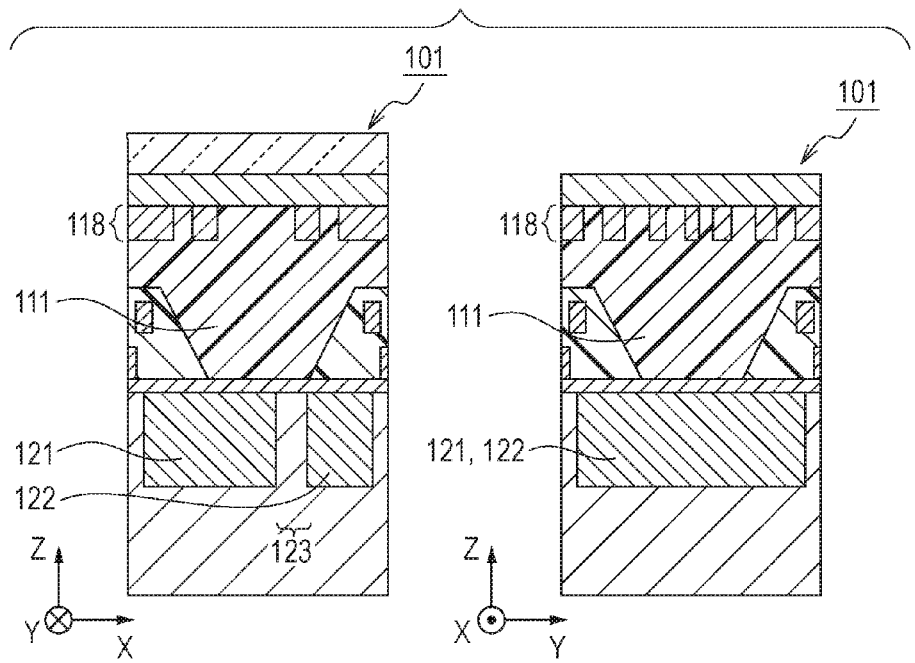

As illustrated in FIGS. 12A to 12D, if a microlens 117 having different levels of refractive power in the X and Y directions is used, the sensitivity of the photoelectric conversion portions 121 and 122 can be increased while the angular dependence of the sensitivity ratio is reduced. FIG. 12A illustrates an outline layout of a pixel 101 in the XY plane (a layout of the pixel 101 that is seen in the direction perpendicular to the substrate 120). FIGS. 12B to 12D each include an X-Z sectional diagram taken along line A-A illustrated in FIG. 12A on the left side and a Y-Z sectional diagram taken along line B-B illustrated in FIG. 12A on the right side.

If the refractive power of the microlens 117 in a first direction (along line A-A) in which the line connecting the center of the first photoelectric conversion portion 121 and the center of the second photoelectric conversion portion 122 to each other extends is high, the distribution of light intensity in the first direction at the entrance face of the waveguide 110 greatly depends on the angle of incidence of the light on the pixel 101 in the first direction. As the first-direction distribution of light intensity at the entrance face of the waveguide 110 becomes more uneven, the first-direction distribution of intensity of the light exiting from the waveguide 110 becomes more uneven. Accordingly, the ratio between the quantities of light that enters the respective photoelectric conversion portions 121 and 122 changes. Thus, if the refractive power of the microlens in the first direction is high, the angular dependence of each of the photoelectric conversion portions 121 and 122 in the first direction is high.

In contrast, the refractive power of the microlens 117 in a second direction (along line B-B) perpendicular to the first direction at the surface of the substrate 120 (in the XY plane) only affects the second-direction distribution of intensity of the light exiting from the waveguide 110. The first photoelectric conversion portion 121 and the second photoelectric conversion portion 122 are provided side by side in the first direction. Therefore, even if the intensity distribution is uneven in the second direction, the change in the ratio between the quantities of light that enters the respective photoelectric conversion portions 121 and 122 is small.

In view of the above, the refractive power of the microlens 117 in the X direction that greatly affects the angular dependence of sensitivity may be reduced, whereas the refractive power of the microlens 117 in the Y direction that little affects the angular dependence of sensitivity may be increased, considering the sensitivity of the photoelectric conversion portions 121 and 122. That is, in the XY plane, the microlens 117 may have a lower refractive power in the first direction in which the line connecting the center of the first photoelectric conversion portion 121 and the center of the second photoelectric conversion portion 122 are connected to each other than in the second direction that is perpendicular to the first direction. Particularly, if the focal point of the microlens 117 in the second direction is defined near the entrance face of the core 111, the sensitivity of the photoelectric conversion portions 121 and 122 is maximized.

In each of the cases illustrated in FIGS. 12A to 12D, the first direction of the microlens 117 corresponds to the X direction, and the second direction of the microlens 117 corresponds to the Y direction. FIG. 12B illustrates a case where the radius of curvature of the light-entrance face of the microlens 117 in the XZ section is larger than that in the YZ section. FIG. 12C illustrates a case where the refractive power in the X direction is zero, that is, a case of a cylindrical lens whose axis extends in the X direction. FIG. 12D illustrates a case of a digital lens 118 which has a plurality of microscopic structures each having a size of about 1/10 of the wavelength or small arranged such that the refractive power in the X direction is lower than the refractive power in the Y direction, whereby the refractive-index distributions in the X direction and in the Y direction are controlled independently of each other.

The above description all concerns a front-side-illuminated solid-state image sensor in which the wiring lines 125 are provided on the same side of the substrate 120 as the waveguide 110. Alternatively, the solid-state image sensor may be of a back-side-illuminated type in which the wiring lines 125 are provided on the other side of the substrate 120 across from the waveguide 110. If the present invention is applied to a back-side-illuminated solid-state image sensor, the layout of the waveguide 110 and the layout of the wiring lines 125 can be determined independently of each other. Therefore, the manufacturing process is simplified. Particularly, if a part of the waveguide 110 extends over an adjacent pixel 101 as illustrated in FIG. 10C, the solid-state image sensor may be of the back-side-illuminated type, because the flexibility in the layout of wiring lines 125 in the front-side-illuminated type is limited by the presence of the waveguide 110.

Arrangement of Pixels in Pixel Area

In the case where a plurality of pixels 101 are provided in the pixel area 103 of the solid-state image sensor 100, the arrangement of the first photoelectric conversion portion 121 and the second photoelectric conversion portion 122 in a single pixel 101 may be the same for all of the plurality of pixels 101 or different between different pixels 101.

Figure 13A:
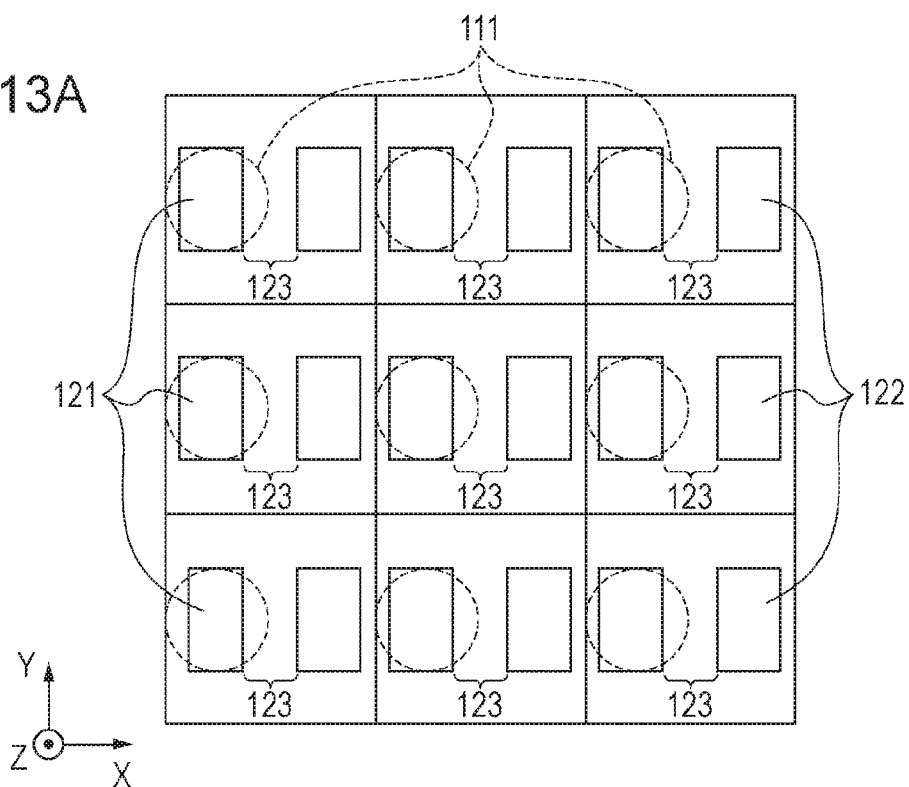
FIGS. 13A and 13B are diagrams each illustrating the arrangement of the first photoelectric conversion portions and the second photoelectric conversion portions included in a plurality of pixels.
Figure 13B:
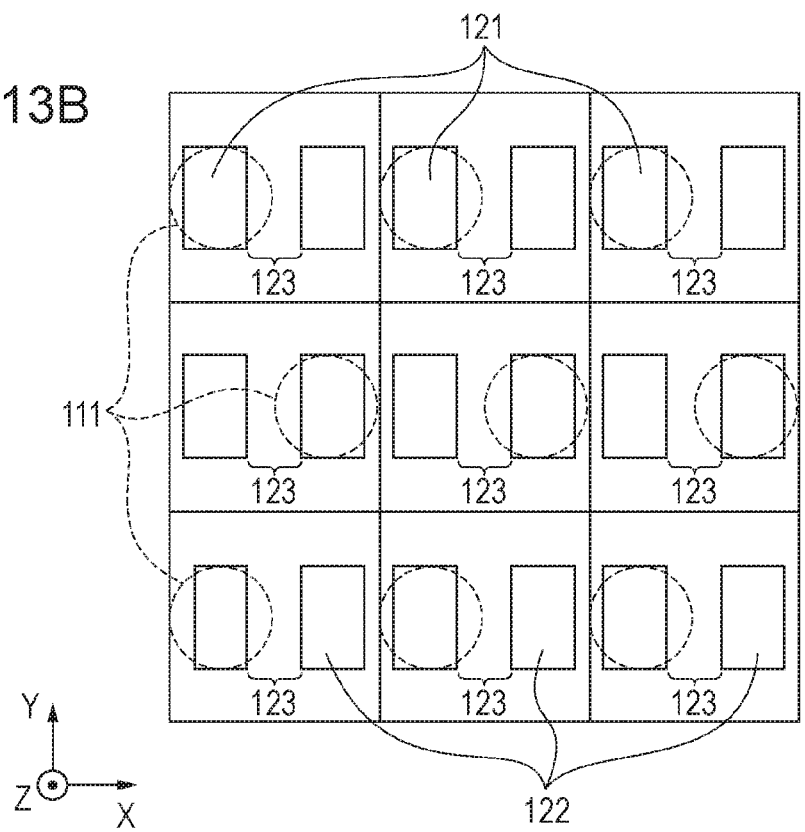

Note that, if a part of the waveguide 110 extends over an adjacent pixel 101 as illustrated in FIG. 10C, an arrangement illustrated in FIG. 13A or 13B may be employed, because the cores 111 of the waveguides 110 of adjacent pixels 101 are prevented from interfering with each other.

FIG. 13A illustrates a case where the direction from the center of the first photoelectric conversion portion 121 toward the center of the second photoelectric conversion portion 122 in a single pixel 101 is the +X direction for all of the pixels 101. FIG. 13B illustrates a case where the direction from the center of the first photoelectric conversion portion 121 toward the center of the second photoelectric conversion portion 122 in a single pixel 101 is opposite between pixels 101 that are adjacent to each other in the direction orthogonal to the line connecting the center of the first photoelectric conversion portion 121 and the center of the second photoelectric conversion portion 122 to each other. In FIGS. 13A and 13B, the first direction of each pixel 101 is the same for all of the pixels 101, and the second direction is therefore the same for both of the adjacent pixels 101.

The direction from the center of the first photoelectric conversion portion 121 toward the center of the second photoelectric conversion portion 122 in a single pixel 101 may be different between different pixels 101. That is, the direction may be the X direction in some pixels 101, the Y direction in other pixels 101, and a direction that is oblique with respect to the X direction in yet other pixels 101.

First Embodiment

A first embodiment of the present invention will now be described with reference to FIG. 1 and FIGS. 2A to 2C. In the first embodiment, the solid-state image sensor according to the present invention is used for forming an image with a wide dynamic range by acquiring a high-sensitivity signal and a low-sensitivity signal and combining the two together.

In the first embodiment, a high-sensitivity signal is acquired by the first photoelectric conversion portion 121, which receives a larger portion of the light, and a low-sensitivity signal is acquired by the second photoelectric conversion portion 122, which receives a smaller portion of the light. The photoelectric conversion portions 121 and 122 are driven by receiving the respective signals transmitted from the peripheral circuits 104 through the wiring lines 125 and in such a manner as to be exposed to light for the same period of time.

The signals acquired by the respective photoelectric conversion portions 121 and 122 are transferred to the peripheral circuits 104 through the wiring lines 125 and are output from the peripheral circuits 104 to an external device. The signals acquired by the photoelectric conversion portions 121 and 122 may be output from the peripheral circuits 104 as they are. Alternatively, a high-sensitivity signal may be output if the quantity of light that is incident on the pixel 101 is smaller than a threshold, and a low-sensitivity signal may be output if the quantity of light that is incident on the pixel 101 is larger than or equal to the threshold. The threshold is set to a value smaller than a value corresponding to the signal intensity at which the high-sensitivity signal is saturated and larger than a value corresponding to the signal intensity at which the low-sensitivity signal exhibits a desired signal-to-noise (SN) ratio.

Figure 14A:
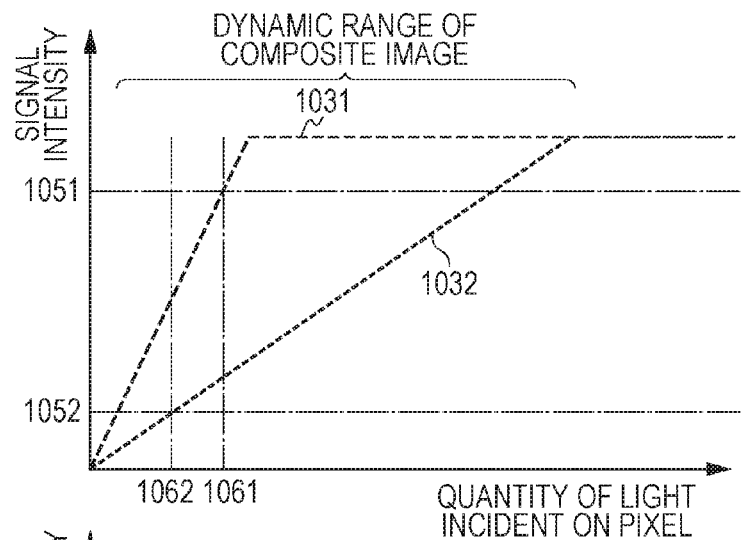
FIGS. 14A to 14C are graphs illustrating the dependence of the intensity of each of a high-sensitivity signal acquired by the first photoelectric conversion portion and a low-sensitivity signal acquired by the second photoelectric conversion portion upon the quantity of light that is incident on the pixel per unit time.
Figure 14B:
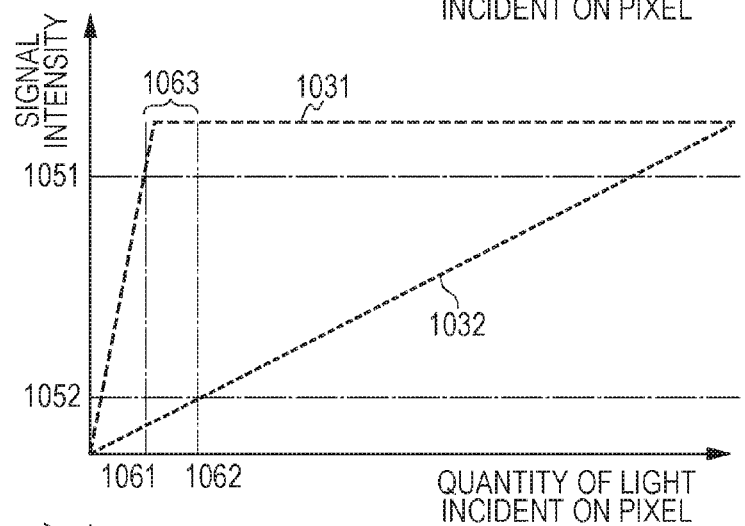
Figure 14C:
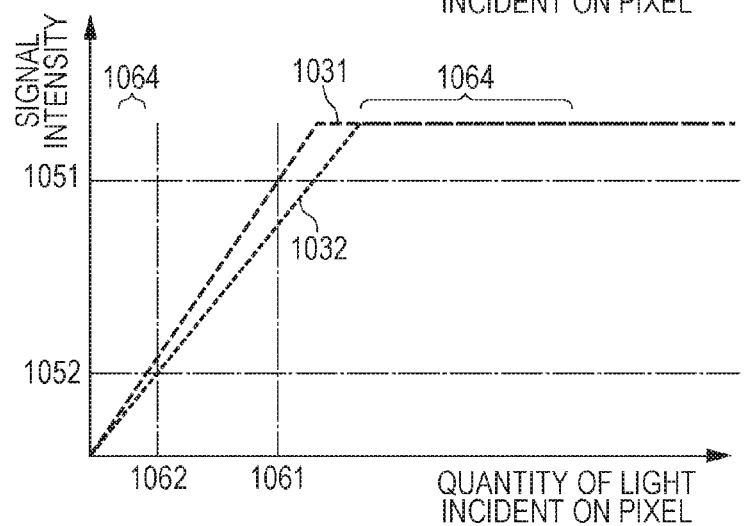

Now, a method of widening the dynamic range by using the high-sensitivity signal and the low-sensitivity signal will be described. FIGS. 14A to 14C are graphs illustrating the dependence of the intensity of each of a high-sensitivity signal 1031 and a low-sensitivity signal 1032 upon the quantity of light that is incident on the pixel 101 per unit time. As illustrated in FIG. 14A, if the intensity of the high-sensitivity signal 1031 is lower than or equal to a first threshold 1051, the high-sensitivity signal 1031 is used. If the intensity of the low-sensitivity signal 1032 is higher than or equal to a second threshold 1052, the low-sensitivity signal 1032 is used. With a combination of the two signals 1031 and 1032, an image with a wide dynamic range is acquired.

The first threshold 1051 is set to a signal intensity lower than the signal intensity at which the high-sensitivity signal 1031 is saturated. The second threshold 1052 is set to a signal intensity at which the SN ratio of the low-sensitivity signal 1032 exceeds a desired value. Hence, a quantity 1062 of light incident on the pixel 101 when the intensity of the low-sensitivity signal 1032 is equal to the second threshold 1052 needs to be smaller than a quantity 1061 of light incident on the pixel 101 when the intensity of the high-sensitivity signal 1031 is equal to the first threshold 1051.

Here, let us consider the case of the related-art solid-state image sensor illustrated in FIGS. 17A to 17C. As can be seen from FIG. 17C, the angular dependence of the sensitivity ratio between the photoelectric conversion portions 1021 and 1022 is particularly high in the angle range 1040. Therefore, the sensitivity ratio between the photoelectric conversion portions 1021 and 1022 changes with the states of the image pickup lens and the aperture that are used. Consequently, image quality may be deteriorated, or the dynamic range may be narrowed. The mechanism of such a situation is as follows.

FIG. 14B illustrates a case where the sensitivity ratio between the first photoelectric conversion portion 1021 and the second photoelectric conversion portion 1022 is high because the image pickup lens used has a large f-number or the size of the aperture is reduced. This case corresponds to, for example, a case where light at an angle within the angle range 1041 indicated in FIG. 17C is incident on the pixel 101.

In such a case, the quantity 1062 of light incident on the pixel 101 when the intensity of the low-sensitivity signal 1032 is equal to the second threshold 1052 is larger than the quantity 1061 of light incident on the pixel 101 when the intensity of the high-sensitivity signal 1031 is equal to the first threshold 1051. Therefore, if the quantity of light incident on the pixel 101 is within a range 1063, the high-sensitivity signal 1031 is saturated while the low-sensitivity signal 1032 has an insufficient SN ratio. Hence, the quality of an image composed may be deteriorated in the range 1063 corresponding to the point of switching between the high-sensitivity signal 1031 and the low-sensitivity signal 1032. The signal is saturated when the quantity of light that is incident on the photoelectric conversion portion exceeds a level at which the amount of charge accumulated in the photoelectric conversion portion reaches the maximum.

Now, let us consider a case where the sensitivity ratio between the first photoelectric conversion portion 1021 and the second photoelectric conversion portion 1022 is low. FIG. 14C illustrates the case where the sensitivity ratio between the first photoelectric conversion portion 1021 and the second photoelectric conversion portion 1022 is low because the lens used has a small f-number or the aperture is fully opened. This case corresponds to, for example, a case where light within an angle range 1042 indicated in FIG. 17C is incident on the pixel 101. In such a case, the quantity of light that is required for the acquisition of a desired SN ratio in the first photoelectric conversion portion 1021 is larger than in the case illustrated in FIG. 14A. In addition, the second photoelectric conversion portion 1022 is saturated with a smaller quantity of light than in the case illustrated in FIG. 14A. Consequently, the dynamic range of an image composed is narrowed by a range 1064 in which the intensity of the high-sensitivity signal 1031 is lower than the second threshold 1052 and another range 1064 in which the low-sensitivity signal 1032 is saturated.

As described above, if the angular dependence of the sensitivity ratio between the photoelectric conversion portions 1021 and 1022 is high, the quality of a resulting image may be deteriorated at the point of switching between the two signals or the dynamic range may be narrowed, depending on the states of the lens and the aperture that are used for applying light to the solid-state image sensor. In contrast, in the solid-state image sensor 100 according to the first embodiment of the present invention, the angular dependence of the sensitivity of each of the photoelectric conversion portions 121 and 122 having different levels of sensitivity is low, as typically graphed in FIG. 3. Therefore, in addition to the above-mentioned reduction in the distortion of a defocused image, an image with an SN ratio that is higher than or equal to the desired level and with a wide dynamic range is acquired.

The required sensitivity ratio between the photoelectric conversion portions 121 and 122 is determined on the basis of the dynamic range or the SN ratio that is required for an image to be composed. In the first embodiment, the amount of shift of the center 113 of the exit face 111E of the core 111 with respect to the center 124 of the barrier region 123 may be determined on the basis of the dynamic range or the SN ratio that is required for an image to be composed.

To widen the dynamic range by combining the two signals, the following relationship needs to be satisfied:

$$C1/S1 > C2/S2 \qquad \text{(Expression 1)}$$

where S1 and C1 denote the sensitivity and the capacity, respectively, of the first photoelectric conversion portion 121 that acquires the high-sensitivity signal, and S2 and C2 denote the sensitivity and the capacity, respectively, of the second photoelectric conversion portion 122 that acquires the low-sensitivity signal.

The reason for this is as follows. If $C1/S1 \leq C2/S2$, the first photoelectric conversion portion 121 that acquires the high-sensitivity signal is saturated with a quantity of light that is smaller than or equal to the quantity of light with which the second photoelectric conversion portion 122 that acquires the low-sensitivity signal is saturated. Moreover, C1/S1 may be twice the C2/S2 or larger. Note that C1/S1 and C2/S2 are each the maximum quantity of light that may be accumulated as charge in a corresponding one of the photoelectric conversion portions 121 and 122.

The ratio between the sensitivity S1 of the first photoelectric conversion portion 121 and the sensitivity S2 of the second photoelectric conversion portion 122 is changeable with the amount of shift of the center 113 of the exit face 111E of the core 111 with respect to the center 124 of the barrier region 123, as described above.

To increase the capacity C1 or C2 of the photoelectric conversion portion 121 or 122, the volume of the photoelectric conversion portion 121 or 122 or the concentration of a dopant for forming the photoelectric conversion portion 121 or 122 may be increased. To increase the volume of the photoelectric conversion portion 121 or 122, the opening of the photoelectric conversion portion 121 or 122 may be widened by increasing the area of ion implantation, or the depth of the photoelectric conversion portion 121 or 122 may be increased by implanting ions deeply into the substrate 120. Note that, if the photoelectric conversion portions 121 and 122 have the same depth and the same dopant concentration, the photoelectric conversion portions 121 and 122 can be formed under the same ion-implantation conditions, whereby the manufacturing process is simplified.

Even if the exposure time for the first photoelectric conversion portion 121 and the exposure time for the second photoelectric conversion portion 122 are not the same, an image with a wide dynamic range can be acquired, as long as the amounts of charge that may be accumulated in the respective photoelectric conversion portions 121 and 122 are different. However, if the exposure time for the first photoelectric conversion portion 121 and the exposure time for the second photoelectric conversion portion 122 are different, the photoelectric conversion portions 121 and 122 particularly cause different levels of motion blur of the object. An image composed in such a manner may appear unnatural. Therefore, the exposure time for the first photoelectric conversion portion 121 and the exposure time for the second photoelectric conversion portion 122 are desired to be the same.

The pixel 101 may include three or more photoelectric conversion portions having different levels of sensitivity. If pixel signals acquired by three or more photoelectric conversion portions having different levels of sensitivity are combined, the dynamic range of an image to be composed can be widened further.

Second Embodiment

A second embodiment of the present invention will now be described. In the second embodiment, the solid-state image sensor according to the present invention is used such that a plurality of photoelectric conversion portions having different levels of sensitivity are driven for different periods of exposure time, whereby an image taken with low sensitivity and a long exposure time and an image taken with high sensitivity and a short exposure time are acquired simultaneously.

In general, the exposure time required for taking a smooth moving image often becomes longer than the exposure time required for taking a still image. Hereinafter, an image taken with low sensitivity and a long exposure time is regarded as a moving image, and an image taken with high sensitivity and a short exposure time is regarded as a still image. If the exposure time for the still image is longer than the exposure time for the moving image, the photoelectric conversion portions provided for acquiring the moving image and the still image, respectively, only need to be interchanged with each other.

The second embodiment is different from the first embodiment in that the exposure time for the first photoelectric conversion portion 121 is shorter than the exposure time for the second photoelectric conversion portion 122. The first photoelectric conversion portion 121 acquires a still-image signal, and the second photoelectric conversion portion 122 acquires a moving-image signal. The signals thus acquired are output from the peripheral circuits 104 and are used for forming a still image and a moving image, respectively.

Let us consider a case of the related-art solid-state image sensor illustrated in FIGS. 17A to 17C. As can be seen from FIG. 17C, the angular dependence of the sensitivity ratio between the photoelectric conversion portions 1021 and 1022 is particularly high in the angle range 1040. Therefore, the sensitivity of each of the photoelectric conversion portions 1021 and 1022 changes with the states of the lens and the aperture that are used. Consequently, the quality of a resulting still image and a resulting moving image may be deteriorated.

For example, if the lens used has a large f-number or the size of the aperture is reduced, the incident angle of the light that enters the pixel 1001 is within the angle range 1041 indicated in FIG. 17C. In the angle range 1041, the sensitivity of the first photoelectric conversion portion 1021 is high, and the sensitivity of the second photoelectric conversion portion 1022 is low. Consequently, the first photoelectric conversion portion 1021 is easily saturated, and overexposure tends to occur in a resulting still image. In addition, the insufficiency in the sensitivity of the second photoelectric conversion portion 1022 tends to cause underexposure in a resulting moving image.

For example, if the lens used has a small f-number or the aperture is fully opened, the incident angle of the light that enters the pixel 1001 is within the angle range 1040 indicated in FIG. 17C. In the angle range 1040, the sensitivity of the first photoelectric conversion portion 1021 is low, and the sensitivity of the second photoelectric conversion portion 1022 is high. Consequently, the sensitivity of the first photoelectric conversion portion 1021 becomes insufficient, and underexposure tends to occur in a resulting still image. In addition, the second photoelectric conversion portion 1022 is easily saturated, and overexposure tends to occur in a resulting moving image.

As described above, if the angular dependence of the sensitivity of each of the photoelectric conversion portions is high, the quality of a resulting still image and a resulting moving image may be deteriorated, depending on the states of the lens and the aperture that are used.

In contrast, in the solid-state image sensor 100 according to the second embodiment of the present invention, the angular dependence of the sensitivity of each of the photoelectric conversion portions 121 and 122 having different levels of sensitivity is low, as typically graphed in FIG. 3. Therefore, in addition to the above-mentioned reduction in the distortion of a defocused image, a moving image and a still image that are of high quality can be acquired simultaneously, regardless of the states of the lens and the aperture that are used.

With the solid-state image sensor 100 according to the second embodiment, different images, i.e., a still image and a moving image, can be formed from the still-image signal acquired by the first photoelectric conversion portion 121 and the moving-image signal acquired by the second photoelectric conversion portion 122, respectively. Therefore, the still-image signal and the moving-image signal may be generated with respective levels of intensity that are as close to each other as possible and with respective dynamic ranges that are as close to each other as possible.

Hence, the following relationships may also be satisfied:

$$S1 \times T1 = S2 \times T2 \qquad \text{(Expression 2)}$$

$$C1/(S1 \times T1) = C2/(S2 \times T2) \qquad \text{(Expression 3)}$$

where S1, C1, and T1 denote the sensitivity, the capacity, and the exposure time, respectively, of the first photoelectric conversion portion 121 that acquires the still-image signal, and S2, C2, and T2 denote the sensitivity, the capacity, and the exposure time, respectively, of the second photoelectric conversion portion 122 that acquires the moving-image signal.

Expression 2 defines a condition regarding the signal intensity. Expression 3 defines a condition regarding the dynamic range.

As described above, the ratio between S1 and S2 is controllable by changing the amount of shift of the waveguide 110. As can be seen from Expression 2, in the second embodiment, the ratio between S1 and S2 can be determined by estimating the exposure time for each of a still image and a moving image to be used. For example, if the exposure time for the moving image is 1/60 seconds and the exposure time for the still image is 1/600 seconds, the pixel 101 is configured such that S1 is ten times S2.

To satisfy Expressions 2 and 3 simultaneously, the capacity C1 of the first photoelectric conversion portion 121 and the capacity C2 of the second photoelectric conversion portion 122 may be the same. Herein, "to be the same" implies that errors due to tolerances in the manufacturing process are permissible. Specifically, if the difference between the capacity C1 of the first photoelectric conversion portion 121 and the capacity C2 of the second photoelectric conversion portion 122 is smaller than 10% of the capacity C1 of the first photoelectric conversion portion 121, the capacities C1 and C2 are regarded as being the same.

Figure 15A:
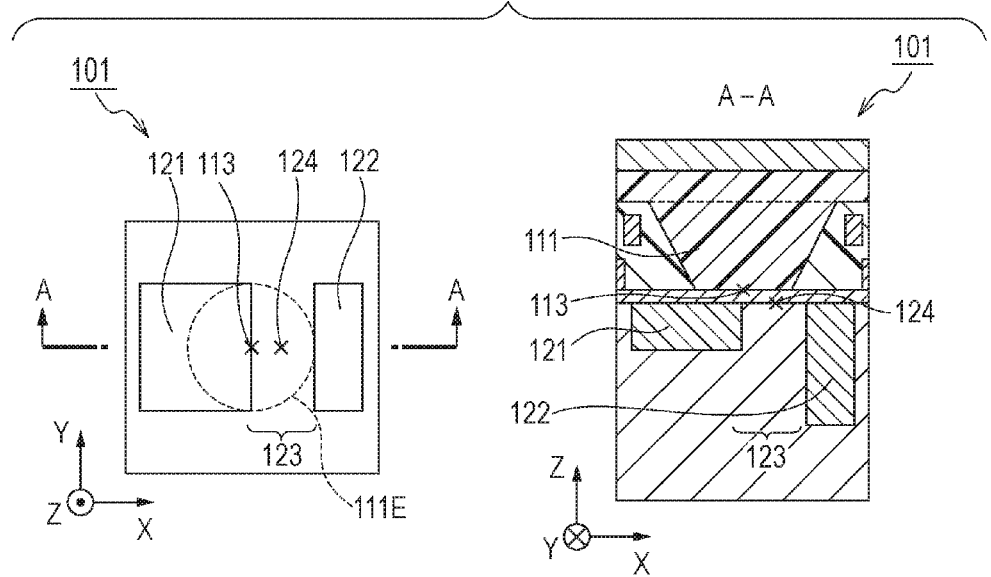
FIG. 15A is a diagram illustrating an exemplary case where the first photoelectric conversion portion and the second photoelectric conversion portion have the same capacity but different Z-direction depths.
Figure 15B:
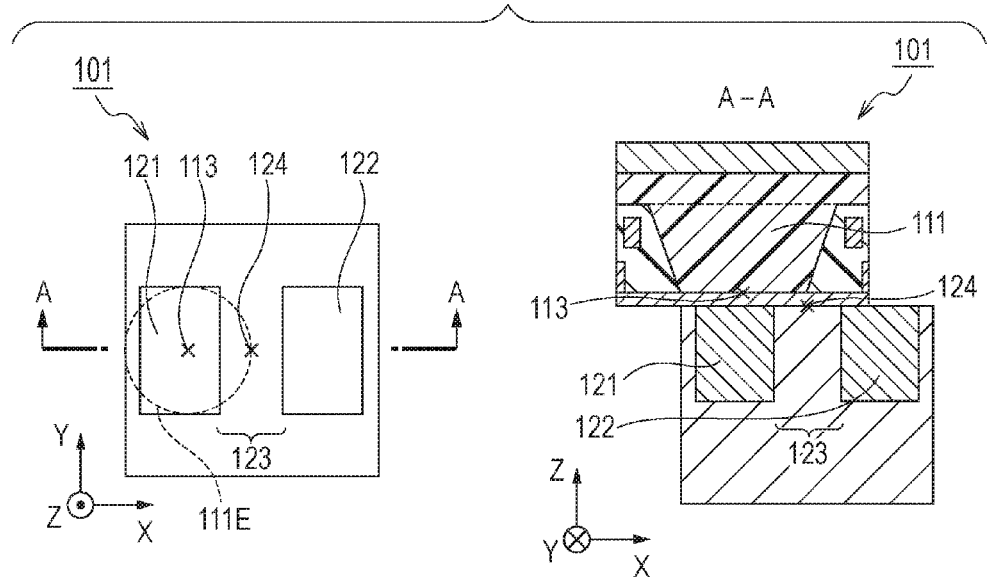
FIG. 15B is a diagram illustrating an exemplary case where the first photoelectric conversion portion and the second photoelectric conversion portion have the same capacity and the same Z-direction depth.

As described above, the capacity of the photoelectric conversion portion is determined by the volume of the photoelectric conversion portion and the concentration of the dopant for forming the photoelectric conversion portion. FIGS. 15A and 15B illustrate different cases in each of which the capacity of the first photoelectric conversion portion 121 and the capacity of the second photoelectric conversion portion 122 are the same. FIGS. 15A and 15B each include, on the left side, an XY plan view of the pixel 101 that illustrates the layout at the surface of the substrate 120 seen in the Z direction (a plan view of the pixel 101 that is seen in the direction perpendicular to the substrate 120) and, on the right side, an XZ sectional view of the pixel 101 that is taken along line A-A illustrated in the XY plan view. In either case, the center 113 of the exit face 111E of the core 111 is shifted toward the first-photoelectric-conversion-portion side (−X side) with respect to the center 124 of the barrier region 123.

In the case illustrated in FIG. 15A, the X-direction length of the first photoelectric conversion portion 121 is longer than the X-direction length of the second photoelectric conversion portion 122, and the Z-direction depth of the first photoelectric conversion portion 121 is greater than the Z-direction depth of the second photoelectric conversion portion 122. In the case illustrated in FIG. 15B, the first photoelectric conversion portion 121 and the second photoelectric conversion portion 122 have the same X-direction length, the same Z-direction depth, and the same dopant concentration. If the photoelectric conversion portions 121 and 122 have the same depth and the same dopant concentration, the photoelectric conversion portions 121 and 122 can be formed under the same ion-implantation conditions, whereby the manufacturing process is simplified. Hence, in terms of the manufacturing process, the configuration illustrated in FIG. 15B is superior.

The pixel 101 may include three or more photoelectric conversion portions. If the exposure time is varied among the three or more photoelectric conversion portions and three or more images based on the respectively different periods of exposure time are acquired simultaneously, a plurality of images having different levels of blur can be acquired. Moreover, photoelectric conversion portions to be used may be selected in accordance with the shutter speed that is set. According to Expressions 2 and 3, suitable characteristics of the photoelectric conversion portions vary with the set shutter speed. Hence, if two of the three or more photoelectric conversion portions are selected, a still-image signal and a moving-image signal with close levels of intensity and close dynamic ranges can be acquired simultaneously.

Signals acquired by a plurality of photoelectric conversion portions exposed to light for the same period of time may be used for the acquisition of an image with a wide dynamic range, and signals acquired by a plurality of photoelectric conversion portions exposed to light for different periods of time may be used for the simultaneous acquisition of a still image and a moving image.

Third Embodiment

Figure 16:
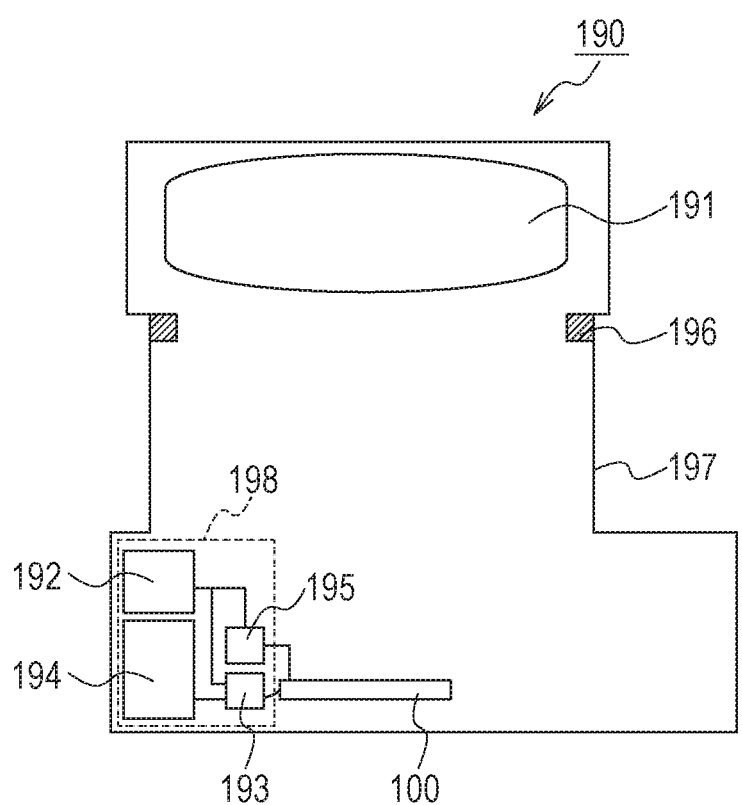
FIG. 16 is a schematic diagram illustrating an image pickup apparatus including the solid-state image sensor according to the embodiment of the present invention.

FIG. 16 is a schematic diagram illustrating an image pickup apparatus 190 including the solid-state image sensor 100 according to any of the embodiments of the present invention. The image pickup apparatus 190 includes a housing 197 having a lens attaching portion 196 to which an image pickup lens 191 is attached, the solid-state image sensor 100, a control section 198 that controls the operation of the image pickup apparatus 190, and the image pickup lens 191 that takes light from the outside into the housing 197. The image pickup lens 191 is attached to the lens attaching portion 196 of the housing 197. The image pickup lens 191 of the image pickup apparatus 190 may be removable from the housing 197, i.e., interchangeable, or may be uninterchangeable. The control section 198 includes a central processing unit (CPU) 192, a transfer circuit 193, a signal processing unit 194, and a device driving circuit 195.

The CPU 192 is a circuit that controls the transfer circuit 193, the signal processing unit 194, and the device driving circuit 195. The device driving circuit 195 is a circuit that drives the solid-state image sensor 100 in accordance with the signal from the CPU 192 and controls, for example, the periods of exposure time for the respective photoelectric conversion portions 121 and 122 provided in each of the pixels 101, and the timings of reading the signals acquired by the photoelectric conversion portions 121 and 122. The transfer circuit 193 stores the signals read from the solid-state image sensor 100 and transfers the signals to the signal processing unit 194. The signal processing unit 194 processes the signals acquired through the transfer circuit 193 into an image.

The image pickup apparatus 190 is selectively operable in a dynamic-range-widening mode in which the solid-state image sensor 100 is driven in accordance with the first embodiment or in a moving-image-and-still-image-simultaneous-acquisition mode in which the solid-state image sensor 100 is driven in accordance with the second embodiment. The mode is selectable by a user through an operation unit (not illustrated). The CPU 192 controls the associated circuits in accordance with the mode selected.

If the dynamic-range-widening mode is selected, the solid-state image sensor 100 is activated such that the first photoelectric conversion portion 121 and the second photoelectric conversion portion 122 are exposed to light for the same period of time and such that the first photoelectric conversion portion 121 having higher sensitivity acquires a high-sensitivity signal and the second photoelectric conversion portion 122 having lower sensitivity acquires a low-sensitivity signal. If the quantity of light that is incident on the pixel 101 is lower than the threshold, the high-sensitivity signal is used. If the quantity of light that is incident on the pixel 101 is higher than or equal to the threshold, the low-sensitivity signal is used. With a combination of the two signals, an image with a wide dynamic range is formed.

If the moving-image-and-still-image-simultaneous-acquisition mode is selected, the solid-state image sensor 100 is activated such that the exposure time for the first photoelectric conversion portion 121 is shorter than the exposure time for the second photoelectric conversion portion 122. If the exposure time is set to a shorter value for the still image than for the moving image for the purpose of, for example, shooting an object that is moving fast, a still-image signal is acquired by the first photoelectric conversion portion 121 having higher sensitivity while a moving-image signal is acquired by the second photoelectric conversion portion 122 having lower sensitivity. If the exposure time is set to a shorter value for the still image than for the moving image for the purpose of, for example, intentionally adding motion blur, a moving-image signal is acquired by the first photoelectric conversion portion 121 having higher sensitivity while a still-image signal is acquired by the second photoelectric conversion portion 122 having lower sensitivity. The exposure time for the still image is determined by the user. The exposure time for the moving image is set to about the value corresponding to the frame rate of the solid-state image sensor 100. Thus, a still image and a moving image can be formed simultaneously from the still-image signal and the moving-image signal acquired in the above manner.

The solid-state image sensor 100 of the image pickup apparatus 190 is not limited to operate on the basis of only one of the first embodiment and the second embodiment. For example, the solid-state image sensor 100 may have both the mode for acquiring an image with a wide dynamic range and the mode for simultaneously acquiring a moving image and a still image so that the mode is switched between the two in accordance with the image to be acquired. In such a case, the levels of sensitivity and the capacities of the first photoelectric conversion portion 121 and the second photoelectric conversion portion 122 need to satisfy at least Expression 1. In addition, Expressions 2 and 3 may also be satisfied.

If both Expressions 2 and 3 are satisfied, the capacity of the first photoelectric conversion portion 121 and the capacity of the second photoelectric conversion portion 122 are the same. Therefore, Expression 1 is naturally satisfied. Hence, in the solid-state image sensor 100 having both the mode for acquiring an image with a wide dynamic range and the mode for simultaneously acquiring a moving image and a still image, the capacity of the first photoelectric conversion portion 121 and the capacity of the second photoelectric conversion portion 122 may be the same.

To summarize, the image pickup apparatus 190 according to the third embodiment is capable of acquiring an excellent image with a wide dynamic range and is also capable of simultaneously acquiring a moving image and a still image.

According to any of the embodiments of the present invention, a solid-state image sensor is provided in which the angular dependence of the sensitivity of each of a plurality of photoelectric conversion portions provided in each pixel and having different levels of sensitivity is reduced, and the deterioration of image quality that may occur depending on the states of a camera lens and an aperture that are used is suppressed.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2015-024485, filed Feb. 10, 2015, which is hereby incorporated by reference herein in its entirety.

What is claimed is:

1. A solid-state image sensor comprising:
pixels provided in a pixel area,
the pixels each including
a first photoelectric conversion portion and a second photoelectric conversion portion that are provided in a substrate, the second photoelectric conversion portion having lower sensitivity than the first photoelectric conversion portion;
a barrier region provided between the first photoelectric conversion portion and the second photoelectric conversion portion;
a waveguide provided on a light-entrance side of the substrate and including a core and a cladding; and
a protective layer provided between the waveguide and the substrate,
wherein, when a surface of the substrate is seen in a direction perpendicular to the substrate, a center of an exit face of the core is positioned on a first-photoelectric-conversion-portion side with respect to a center of the barrier region at the surface of the substrate in each of pixels that are provided in a central part of the pixel area, and
wherein a standard deviation of a distribution of refractive index of the protective layer in a region directly below the exit face of the core is 0.1 or smaller in an in-plane direction of the substrate.

2. A solid-state image sensor according to claim 1, wherein, when the surface of the substrate is seen in the direction perpendicular to the substrate, a second-photoelectric-conversion-portion-side end of the exit face of the core is positioned on the first-photoelectric-conversion-portion side with respect to a center of the second photoelectric conversion portion.

3. A solid-state image sensor according to claim 1, wherein an optical distance between the exit face of the core and the surface of the substrate is, at maximum, twice a center wavelength of light that is sensible by the first photoelectric conversion portion and the second photoelectric conversion portion.

4. A solid-state image sensor according to claim 1, wherein, when the surface of the substrate is seen in the direction perpendicular to the substrate, a center of an entrance face of the core coincides with the center of the exit face of the core.

5. A solid-state image sensor according to claim 1, further comprising a microlens provided on the light-entrance side with respect to an entrance face of the wave guide.

6. A solid-state image sensor according to claim 5, wherein a refractive power of the microlens in a first direction in which a line connecting a center of the first photoelectric conversion portion and a center of the second photoelectric conversion portion to each other extends is lower than a refractive power of the microlens in a second direction perpendicular to the first direction in a plane parallel to the surface of the substrate.

7. A solid-state image sensor according to claim 1, further comprising a wiring line that transmits signals acquired by the first photoelectric conversion portion and the second photoelectric conversion portion, the wiring line being provided on a side of the substrate that is opposite the side on which the waveguide is provided.

8. A solid-state image sensor according to claim 1, wherein the barrier region has a potential barrier whose height is greater than or equal to a height of a potential barrier of a region excluding the barrier region and surrounding the first photoelectric conversion portion and the second photoelectric conversion portion.

9. A solid-state image sensor according to claim 1, wherein the central part is an area within a distance from a center of the pixel area of ¼ of a length of a diagonal of the pixel area.

10. A solid-state image sensor according to claim 1, wherein a direction from the center of the first photoelectric conversion portion toward the center of the second photoelectric conversion portion in a single pixel is opposite between pixels that are adjacent to each other in a direction orthogonal to the line connecting the center of the first photoelectric conversion portion and the center of the second photoelectric conversion portion to each other at the surface of the substrate.

11. A solid-state image sensor according to claim 1, wherein a signal acquired by the first photoelectric conversion portion is output if a quantity of light that is incident on the pixel is smaller than a predetermined threshold, and a signal acquired by the second photoelectric conversion portion is output if the quantity of light that is incident on the pixel is larger than the predetermined threshold.

12. A solid-state image sensor according to claim 1, wherein exposure time for the first photoelectric conversion portion is shorter than exposure time for the second photoelectric conversion portion.

13. A solid-state image sensor according to claim 12, wherein the following relationships are satisfied:

$$S1 \times T1 = S2 \times T2, \text{ and}$$

$$C1/(S1 \times T1) = C2/(S2 \times T2),$$

where $S1$, $C1$, and $T1$ denote sensitivity, capacity, and exposure time, respectively, of the first photoelectric conversion portion, and $S2$, $C2$, and $T2$ denote sensitivity, capacity, and exposure time, respectively, of the second photoelectric conversion portion.

14. An image pickup apparatus comprising:
the solid-state image sensor according to claim 1 that is provided in a housing.

15. An image pickup apparatus according to claim 14, wherein an image is formed by using a signal acquired by the first photoelectric conversion portion if a quantity of light that is incident on the pixel is smaller than a predetermined threshold and by using a signal acquired by the second photoelectric conversion portion if the quantity of light that is incident on the pixel is larger than the threshold.

* * * * *